United States Patent [19]

Kusui et al.

[11] Patent Number: 5,030,836
[45] Date of Patent: Jul. 9, 1991

[54] METHOD AND APPARATUS FOR DRAWING PATTERNS USING AN ENERGY BEAM

[75] Inventors: Naoki Kusui, Mishima; Akira Suzuki; Katsuji Tanaka, both of Numazu; Kuniyoshi Wakazaki, Mishima; Mitsunobu Katayama, Mishima; Shiro Kurasawa, Mishima; Taizan Goto, Numazu, all of Japan

[73] Assignee: Toshiba Machine Co., Ltd., Tokyo, Japan

[21] Appl. No.: 389,861

[22] Filed: Aug. 4, 1989

[30] Foreign Application Priority Data

| Aug. 5, 1988 | [JP] | Japan | 63-195913 |
| Sep. 19, 1988 | [JP] | Japan | 63-234637 |
| Sep. 19, 1988 | [JP] | Japan | 63-234638 |
| Nov. 18, 1988 | [JP] | Japan | 63-293405 |
| May 25, 1989 | [JP] | Japan | 1-132374 |

[51] Int. Cl.⁵ .......................................... H01J 37/30
[52] U.S. Cl. .......................... 250/492.22; 250/492.2
[58] Field of Search ............... 250/492.2, 492.22, 398

[56] References Cited

U.S. PATENT DOCUMENTS

| 3,900,737 | 8/1975 | Collier et al. | 250/492.2 |
| 4,267,456 | 5/1981 | Hidai et al. | 250/492.22 |
| 4,445,039 | 4/1984 | Yew | 250/492.22 |
| 4,531,191 | 7/1985 | Koyama | 250/492.22 |
| 4,532,598 | 7/1985 | Shibayama et al. | 250/492.22 |
| 4,538,232 | 8/1985 | Koyama | 250/492.22 |

Primary Examiner—Bruce C. Anderson
Attorney, Agent, or Firm—Oblon, Spivak, McClelland, Maier & Neustadt

[57] ABSTRACT

According to the invention, in a method of drawing patterns by use of an energy beam, the amount of drawing data is reduced, the irregularity of an array of patterns is prevented, and the patterns are drawn with great accuracy. In a method of drawing a pattern including a plurality of patterns, the amount of drawing data is reduced and the pattern can be drawn enlarged or reduced at a given scale in X-axis direction and/or Y-axis direction. Furthermore, if the pattern includes patterns symmetrical with respect to a line, the amount of drawing data is reduced by use of the symmetry of the drawing data. In addition, in case where patterns are arrayed on a first curved line, the pattern can be drawn as being arrayed on a straight line by performing the shift of a table or deflection of the energy beam parallel to the curved on which patterns are arrayed or approximating it at a second curved line using partial approximate straight lines.

15 Claims, 16 Drawing Sheets

| FRAME NUMBER (Pi) |
|---|
| ~ |
| PATTERN CODE (pi) |
| PATTERN POSITION X COORDINATE (xi) |
| PATTERN POSITION Y COORDINATE (yi) |
| ENLARGEMENT/ REDUCTION SCALE (Si) |
| PATTERN CODE (pi-1) |
F I G. 10A
| PATTERN DATA |
|---|
| ~ |
| DIVIDED PATTERN CODE |
| X COORDINATE |
| Y COORDINATE |
| BASE LENGTH L |
| HEIGHT H |
| LEFT SIDE LENGTH X1 |
| RIGHT SIDE LENGTH X2 |
| DIVIDED PATTERN CODE |
F I G. 10B
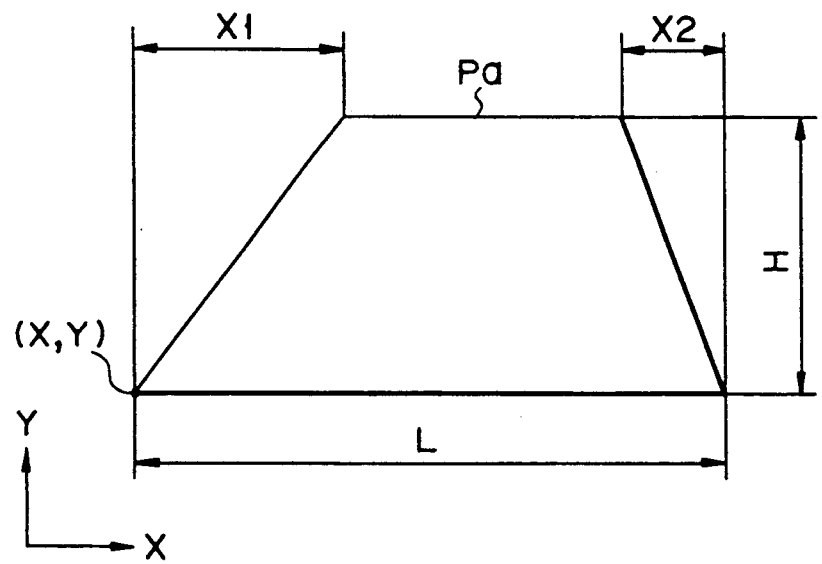
F I G. 11

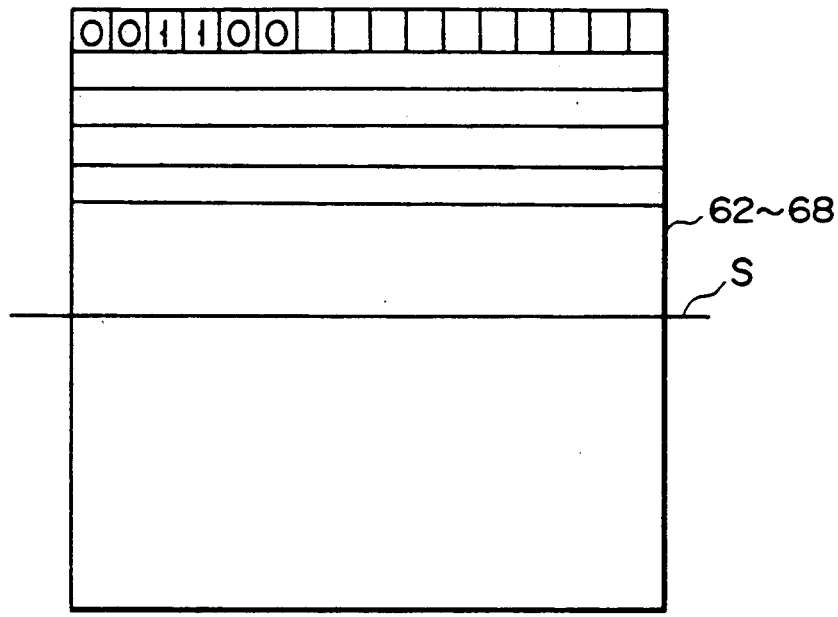
F I G. 15
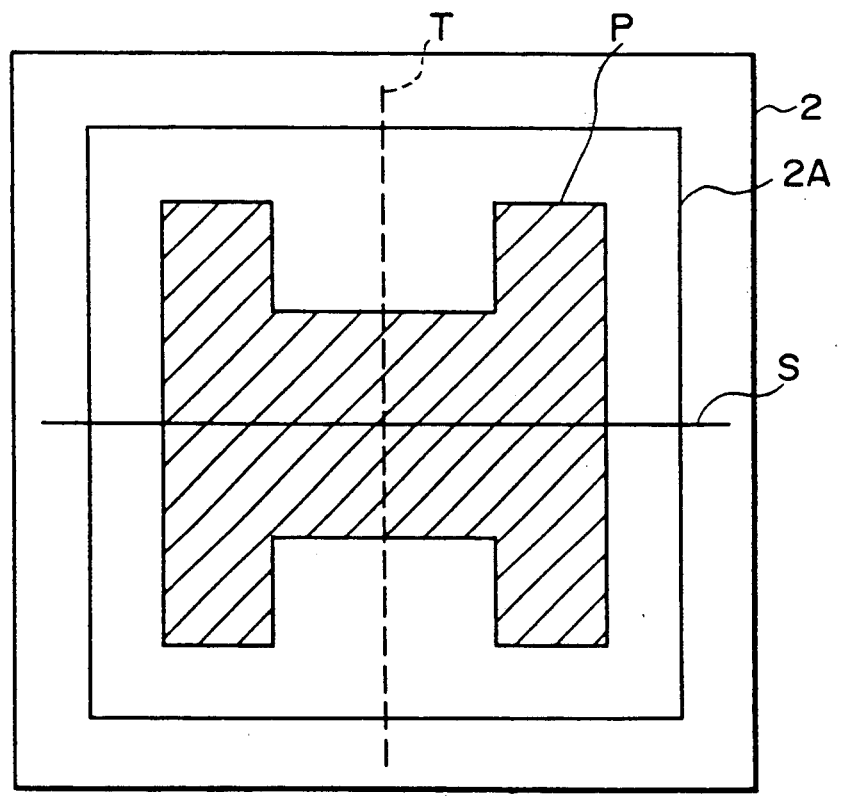
F I G. 16

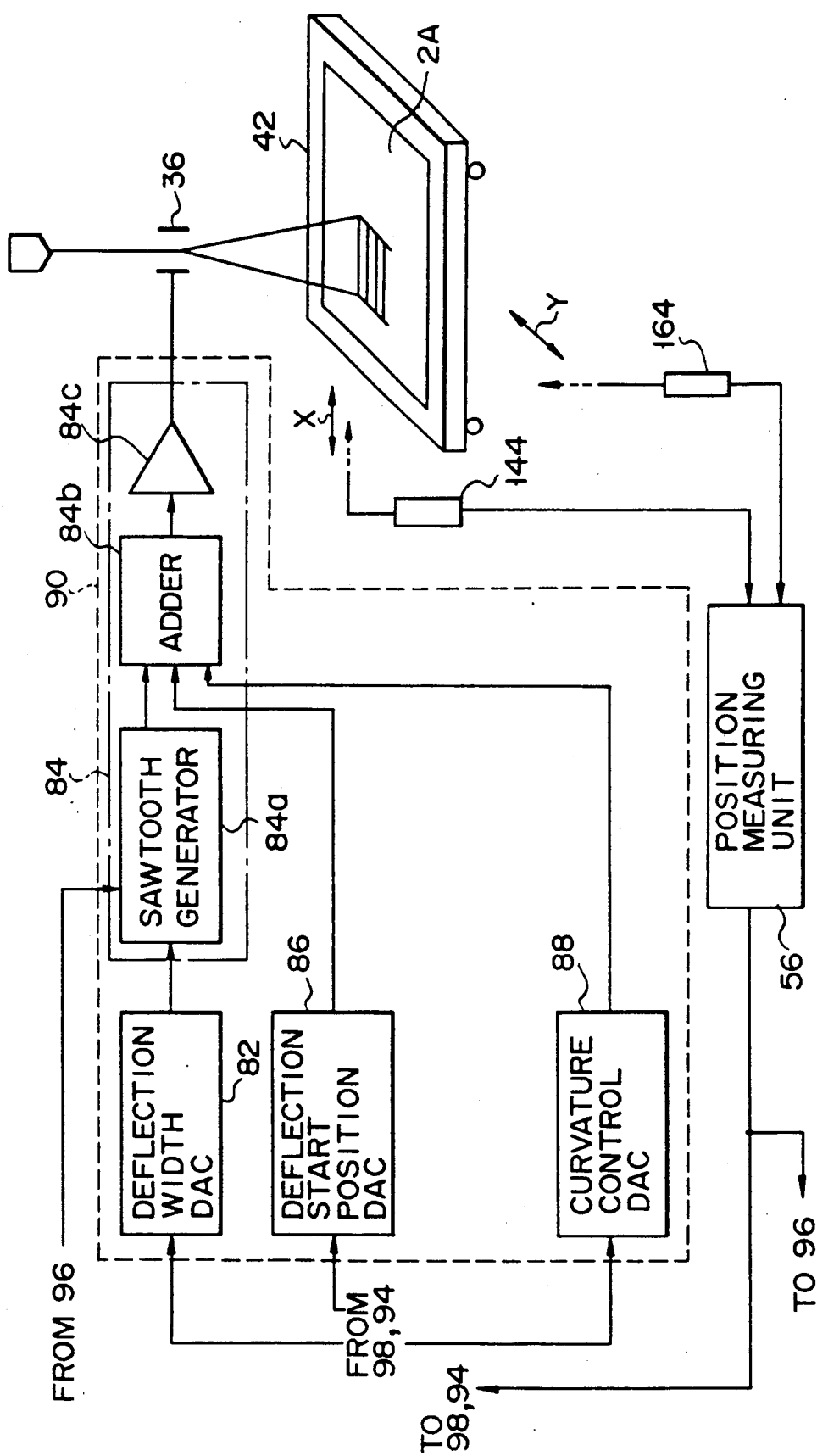
F I G. 17

METHOD AND APPARATUS FOR DRAWING PATTERNS USING AN ENERGY BEAM

BACKGROUND OF THE INVENTION

1. Field of the Invention

The present invention relates a method and apparatus for drawing patterns with electromagnetic radiation such as a charged beam emitted from an electron gun or a laser beam produced by a semiconductor laser, and more particularly, to a method and apparatus which precisely and efficiently draws a plurality of arrayed patterns with an energy beam.

2. Description of the Related Art

Various methods of drawing a plurality of patterns with an energy beam are known. Among these are the raster scan method, the general method, the vector scan method, and the scaling method. In the raster scan method, a drawing region is divided into subregions of the same width, and the subregions are raster-scanned in sequence, thereby drawing patterns in these subregions. In the vector scan method, patterns (or characters) are drawn within drawing regions, respectively. In the general method, patterns are drawn either enlarged or reduced, by using data representing the enlarged or reduced patterns and also the data representing the region in which all patterns are to be drawn. In the scaling method, enlarged or reduced patterns are drawn by varying drawing parameters such as the diameter of the energy beam, the drawing-start position, the scan width, the scan spacing, and the speed of the drawing region, in accordance with only one piece of drawing data.

The methods described above are classified into two in accordance with the size of the energy beam used. The first is the sized beam method, in which an energy beam is used whose cross-sectional size remains unchanged. The second is the variable sized-beam method, in which an energy beam is used whose cross-sectional size and/or strength is changed.

In any method described above, patterns are drawn in accordance with drawing data including the data representing all patterns to be drawn in a region and the data representing the positions in the region where the patterns are to be drawn. Such position data need not be used to draw a plurality of identical patterns in a plurality of regions, respectively, as in the method which is disclosed in U.S. Pat. No. 3,900,737. In this method, identical patterns are drawn on semiconductor chips, by repeatedly using the drawing data representing the unit pattern, and no data is required which shows the positions at which to draw the unit patterns.

In this regard it should be noted that much time is required to prepare drawing data representing large and complex patterns. Moreover, to store such drawing data, a data storage device of a great capacity, such as a magnetic disk device, is required. When the amount of drawing data is relatively large, two or more data storage devices must be used.

In the conventional raster scan method, the drawing data includes not only the pieces of data representing the patterns, but also the pieces of data representing the spaces among these patterns, and the unit determining the size of the subregions is the diameter of the energy beam used to drawn patterns in these subregions. When the patterns have a size defined by this unit each, they will be correctly aligned in the drawing region. However, if it is required to arrange some of the arrayed patterns to be indivisible by the minimum drawing dimensional unit (i.e., some of the arrayed patterns are misaligned with the minimum drawing dimensional unit in their edges) to form fractional portions, the resultant fractional portions must be rounded off, resulting in inaccurate array of patterns which appears as a striped pattern.

Though the minimum unit is controllable in enlarging or reducing each pattern, its controllability is restricted by the beam size. Therefore, precise control cannot be performed.

When the scaling method is used, it is possible to vary the size of patterns can be by a value less than the diameter of the beam. However, each pattern must have identical width (i.e., the X-axis dimension) and length (i.e., the Y-axis dimension), and patterns must have the same size. Thus it is impossible with the scaling method to draw patterns which differ very much in size. Further, this method requires much time to change the drawing parameters such as the diameter of the beam and the speed of the drawing region to desired values, and it is practically impossible to vary these parameters within a period between the completion of drawing one pattern and the start of drawing the next one. Hence, the drawing must be interrupted to change the scaling factor, and patterns cannot be continuously drawn in different scaling factors.

Moreover, even in drawing line-symmetric patterns, drawing data need to be prepared for all the pattern drawing regions, which would increase the storage capacity of a memory for storing drawing data.

In an array in which identical patterns are arranged along a curved line on the X and Y coordinates, for example, in an array of slits of the shadow mask of a TV cathode ray tube in which the above stripe areas to be drawn are divided linearly, the patterns are different from each other in position on their own X and Y coordinates and thus they have to be handled as separate patterns each of which requires drawing data including both pattern information and position data. Hence the drawing data would require a very long time for preparation thereof and moreover would be much large in amount. Furthermore, joints of the areas would be not completely aligned with respect to each other, resulting in some defects and protrusions. They would appear as stripes or lines on the resultant patterns, significantly degrading the quality of the sample.

SUMMARY OF THE INVENTION

It is a first object of the present invention to provide a method of accurately drawing a plurality of arrayed patterns which permits reduction of amount of drawing data required and suppression of generation of irregularities of the array. It is a second object of the present invention to provide a method of continuously drawing patterns including plural types of patterns which are enlarged or reduced at a suitable factor in one or both of the directions of X and Y axes. It is a third object of the present invention to provide a method of drawing patterns including patterns arrayed symmetrically with respect to a line, which permits reduction of amount of drawing data utilizing the symmetry of the pattern array. It is a further object of the present invention to provide a method and apparatus for drawing patterns arrayed along a curved line efficiently and accurately by utilizing a small amount of drawing data.

According to the invention, there is provided a method of drawing a plurality of arrayed patterns using a raster-scan energy-beam drawing system comprising the steps of: determining a raster scan width so that each of the arrayed patterns may be kept within the raster scan width; inputting pattern data and position data representing the configuration and position of each of the patterns, respectively into the energy-beam drawing system; changing in accordance with the position data the relative position between a substrate and the energy beam with respect to a direction in which the energy beam is scanned before drawing of each of the patterns is started; and drawing patterns in accordance with the pattern data while controlling in accordance with the position data the relative position between the sample and the energy beam with respect to a direction normal to the scanning direction so as to have the relative position coincide with the drawing position of each pattern.

There is provided a method for drawing a plurality of arrayed patterns by a raster-scan energy-beam drawing system wherein, when the position information contains a fraction smaller than a minimum drawing dimensional unit defined by the size of the energy beam in a direction normal to the scan direction, the position information is given by varying the relative position of the sample and the energy beam in the direction normal to the scan direction by the fraction.

There is provided a method of drawing pattern in which a plurality of patterns are arrayed enlarged or reduced with respect to a basic pattern in at least one of directions of X and Y axes, comprising the steps of: supplying a drawing system with pattern data representing the basic pattern and position data including positions of the patterns and scales of enlargement or reduction with respect to the basic pattern; controlling a position in which drawing of each of the patterns is started, and a scan width and scan spacing of an energy beam in accordance with the position data; and turning the energy beam ON and OFF in accordance with the pattern data.

There is provided a method of drawing pattern including arrayed patterns symmetrically with respect to an axis by use of an energy beam, comprising the steps of: supplying an energy beam drawing system with drawing data for pattern on only one side of the axis of symmetry; drawing the one pattern in accordance with the drawing data; for drawing the pattern on the only one side of the axis of symmetry in accordance with the drawing data; and modifying the drawing data during a time period from readout to drawing of the drawing data such that the other pattern to be drawn on the opposite side of the axis of symmetry will be symmetric with respect to the axis of symmetry when drawing the other pattern on the opposite side of the axis of symmetry.

In addition, there is provided a drawing method in which drawing data segmented as arrayed of areas and drawing data for each of divided unit areas is converted to energy beam control information, the read out sequence of the segmented area drawing data is read into a converter of the drawing system reversely with respect to the axis of symmetry and the drawing data for the unit areas is varied with respect to the direction of the axis of symmetry such that the drawing data is symmetric with respect to the axis of symmetry.

There is provided a drawing method for drawing patterns by converting drawing data to bit pattern data, which is energy beam control information, for each of the unit areas, the read out sequence of the drawing data is read into the converter of the drawing system reversely with respect to the axis of symmetry and the read out sequence of the bit pattern data is also read from the converter into the drawing system reversely with respect to the axis of symmetry to draw symmetrically with respect to the axis of symmetry.

There is provided a method of drawing a pattern on a sample placed on a table by shifting the table continuously in a first direction while irradiating a selected area within a predetermined range with an energy beam and step-shifting the table in a second direction normal to the first direction at the end of the continuous shift in the first direction, comprising the steps of: continuously shifting the table while controlling the relative position of the area irradiated with the energy beam and the table in the second direction so that the locus of the area irradiated with the energy beam on the sample may become a first curved line substantially parallel to the first direction or an approximate second curved line composed of partial approximate straight lines, to thereby draw the pattern along the curved first line.

There is provided a method for drawing patterns by scanning the energy beam in the direction of the normal of the first curved line or the approximate second curved line so that the selected area within the predetermined range is irradiated with the energy beam.

There is provided a method of drawing a pattern on a sample placed on a table by shifting the table continuously in a first direction while irradiating a selected area within a predetermined range with an energy beam and step-shifting the table in a second direction normal to the first direction at the end of the continuous shift in the first direction, in which the shape of the cross section of the energy beam coincides with said pattern, and the energy beam is irradiated on a drawing position on the sample.

There is further provided a drawing system comprising: a device for directing an energy beam to a selected area within a predetermined range; a table driving device for continuously moving an XY table in a first direction and shifting the table in a second direction normal to the first direction according to a command value from a table control unit; a device for controlling the operation of the energy beam directing device according to the position of the table in the first direction; and a device for supplying at least one of a deflecting device for defecting the energy beam the area irradiated with the energy beam in the second direction and a driving device of the table driving device for driving the table in the second direction with a curve interpolation signal for shifting the energy beam in the second direction during the continuous movement of the table or shifting the table in the second direction so that the locus of the area irradiated with the energy beam during the continuous shift may become a first curved line substantially parallel to the first direction or an approximate curved line composed of partial approximate straight lines.

There is provided a drawing system further comprising an operation section for calculating the direction of the normal of the first curved line or the approximate second curved line in the position irradiated with the energy beam in accordance with the curve interpolation signal representing the first curved line or approximate second curved line, and a device for generating a deflecting signal for correcting the scan direction of the energy beam within the predetermined range to be parallel to the direction of the normal in accordance with a signal representing the direction of the normal calculated by the operation section.

There is provided a drawing system in which a device for directing the energy beam includes a plate having an opening corresponding to the shape of a pattern, the cross section of the energy beam is being made to coincide with the shape of the pattern through said opening, and means for shifting the energy beam in accordance with the movement of the table.

According to the present invention, as described above, each of patterns is drawn within a raster scan width. The frame imposes no restriction upon the array of the patterns. Moreover, each pattern is drawn with high accuracy in units of position controllable dimensions (approximate 0.01 micron) of the sample or energy beam. When all the patterns are of the same form, one piece of pattern data is input and utilized repeatedly. When there are several types of pattern forms, pattern data for each pattern form is entered and utilized repeatedly or one piece of pattern data is conversion for utilization, thus significantly reducing the amount of drawing data stored in an external storage device. According to the scale of enlargement or reduction of each pattern in the direction of X axis and/or Y axis, if the pattern is enlarged in the X-axis direction, the scan width is increased, otherwise it is decreased. On the other hand, if pattern is enlarged in the Y-axis direction, the scan spacing is increased, otherwise it is decreased. Likewise the drawing data can be decreased in amount. When each basic pattern is line symmetric, all the patterns can be drawn with half the amount of drawing data. If there are four axes of symmetry, the drawing data will be decreased to ¼ in amount. In addition, patterns which are actually arrayed along a curved line are processed as being arrayed on a straight line from the viewpoint of drawing data so that curved patterns parallel to a curved line are processed as liner patterns. A pattern to be drawn will be never divided by the scan width.

BRIEF DESCRIPTION OF THE DRAWINGS

FIGS. 10A and 10B illustrate drawing data stored in an external storage device for drawing patterns on the sample in accordance with the drawing image method of the second embodiment of the present invention;

FIG. 11 illustrates a pattern representing tapezoidal format data which is one example of the drawing data stored i the external storage device;

FIG. 15 is a conceptual diagram illustrating the division of a bit pattern memory used for drawing patterns on a sample in the third embodiment of the present invention;

FIG. 16 is a diagram illustrating a method of dividing a pattern in the third embodiment of the present invention;

FIG. 17 is a block diagram of a device for deflecting an electron beam in a fourth embodiment of the present invention;

DETAILED DESCRIPTION OF THE PREFERRED EMBODIMENTS

Figure 1:
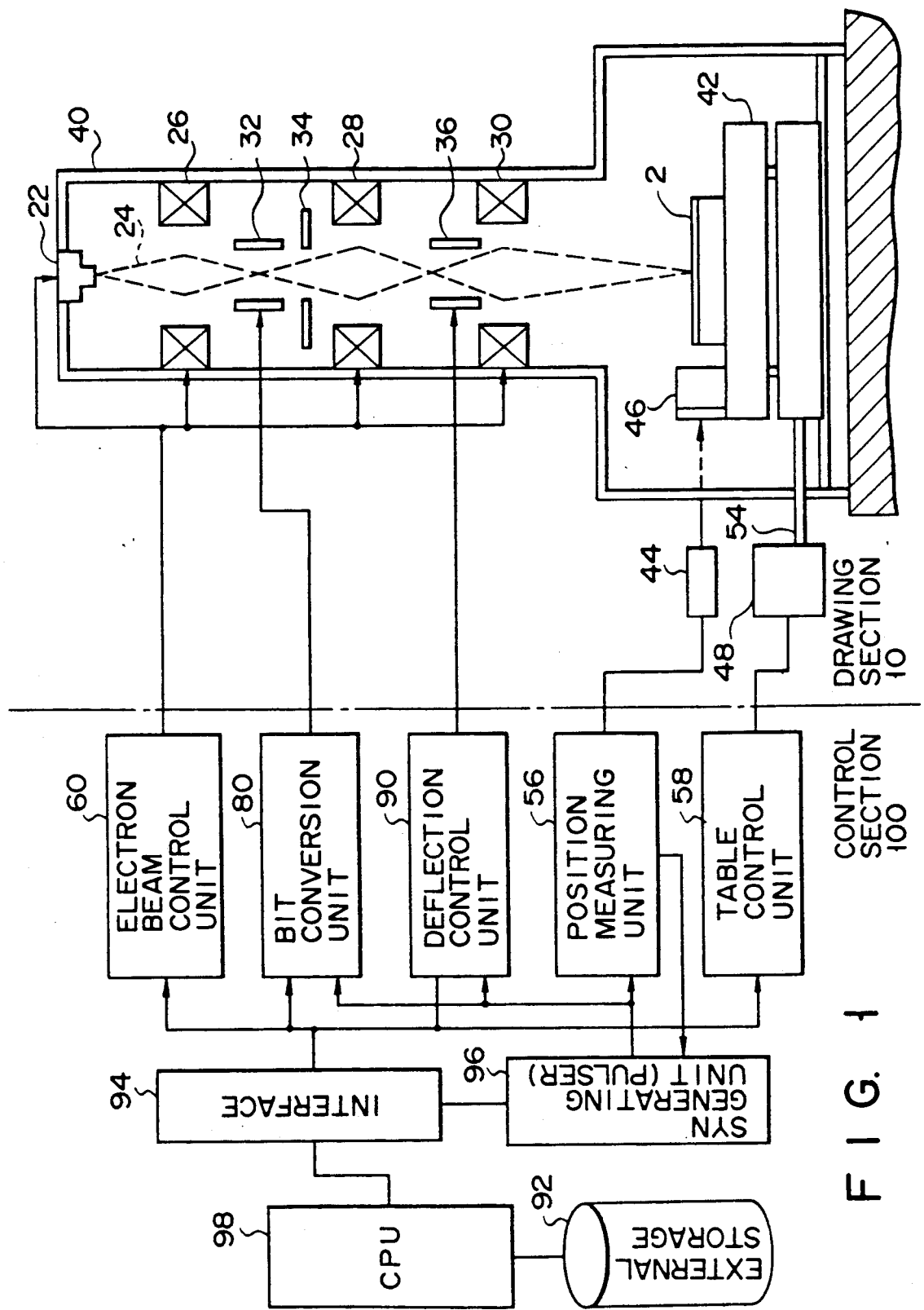
FIG. 1 is a schematic diagram illustrating an electron beam lithography system including a drawing section 10 and a control section 100.

Referring now to FIG. 1, an energy beam or an electron beam drawing image system embodying the present invention includes a drawing section 10 which draws patterns on a sample 2 placed on a table 42 by using an electron beam 24 and a control section 100 for controlling drawing section 10.

In drawing section 10, sample 2 on which patterns are drawn is placed on table 42. An electron gun 22 emits electron beam 24, which is directed to an electron lens 26 which is driven by electron beam control unit 60. Then, electron beam 24 is directed to and focused at a blanking electrode 32 which is turned ON and OFF by a signal from a bit conversion unit 80 adapted to convert drawing data to bit information. When blanking electrode 32 is ON, electron beam 24 is allowed to pass through the aperture of a blanking plate 34. When blanking electrode 32 is OFF, electron beam 24 is directed to blanking plate 34 to be cut off. Electron beam 24 passed through blanking plate 34 is again focused by an electron lens 28, passes through a deflecting electrode 36, and is focused onto sample 2 by objective lens 30. Electron beam 24 is deflected over sample 2 in the direction of X axis or Y axis by deflecting electrode 36 responsive to a deflection signal for deflecting the beam from a deflection control unit 90. Electron beam 24 deflected by deflecting electrode 36 is focused onto sample 2 by means of an electron lens 30 so that a pattern is drawn on sample.

Table 42 on which sample 2 is placed is selectively moved along X and/or Y axis by a motor section 48. That is, a laser length measuring device 44 detects change in distance up to table 42 with the help of a mirror 46 mounted on the table, and table 42 is moved by driving motor section 48 in accordance with a control signal from table control unit 58 which is responsive to outputs of a position measuring unit 56 which detects the position of table 42 on the basis of the value detected by laser length measuring device 44 and mirror 46. Therefore, the drawing region of sample 2 on table 42 moves.

Control section 100 includes electron beam control unit 60 for controlling the sectional size and/or strength of electron beam 24, bit conversion unit 80 for generating a control signal to turn ON and OFF blanking electrode 32 and deflection control unit 90 for providing a deflection signal to deflection electrode 36 so as to deflect electron beam 24 over sample 2. These units are coupled to a central processor unit (CPU) 98. A position measuring unit 56 including a laser length measuring device 44 and a mirror 46 adapted to detect the position of table 42 on which sample 2 is placed, and a table control unit 58 for generating a signal for controlling the position of table 42 in accordance with a signal from position measuring unit 56 are connected to CPU 98 via a pulser 96 for generating sync signals. With CPU 98 is associated with an external storage device 92, such as magnetic disk device, for storing drawing data of pattern data and position information represented in a predetermined format.

Figure 2:
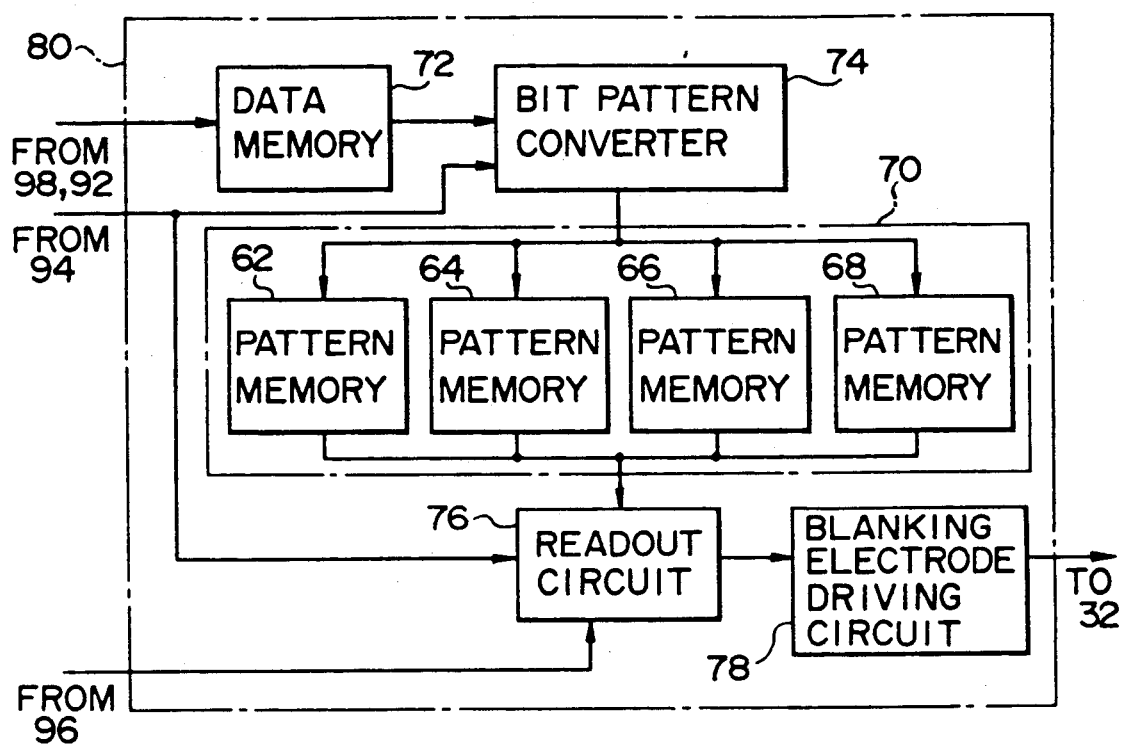
FIG. 2 is a simplified block diagram of the bit conversion unit of FIG. 1.

FIG. 2 schematically illustrates bit conversion unit 80, which comprises a data memory 72 into which pattern data within the drawing data is read, a bit pattern converter 74 for converting the pattern data read into data memory 72 to bit pattern data for turning blanking electrode 32 ON and OFF and a pattern memory 70 (having a plurality of pattern memories 68, 66, 64, 62) for tempolarily storing the bit pattern data. That is, in bit conversion unit 80, pattern data stored, for example, in a tapezoidal format, or geometrically compressed data (pattern data corresponding to a drawing region 16 for drawing one pattern 12 (see FIG. 7) is one of frames 20 which are produced by dividing in the Y axis direction a pattern drawing region 2A on sample 2 shown in FIG. 3, i.e., one pattern data selected from a pattern data group shown in FIG. 6B) is read into data memory 72 as explained below and then converted to bit pattern data for driving blanking electrode 32 to turn electron beam 24 ON and OFF. The drawing data is read into data memory 72 before the position of sample 2 is detected by CPU 98 through position measuring unit 56 and frames 20 are subjected to pattern drawing.

Figure 4:
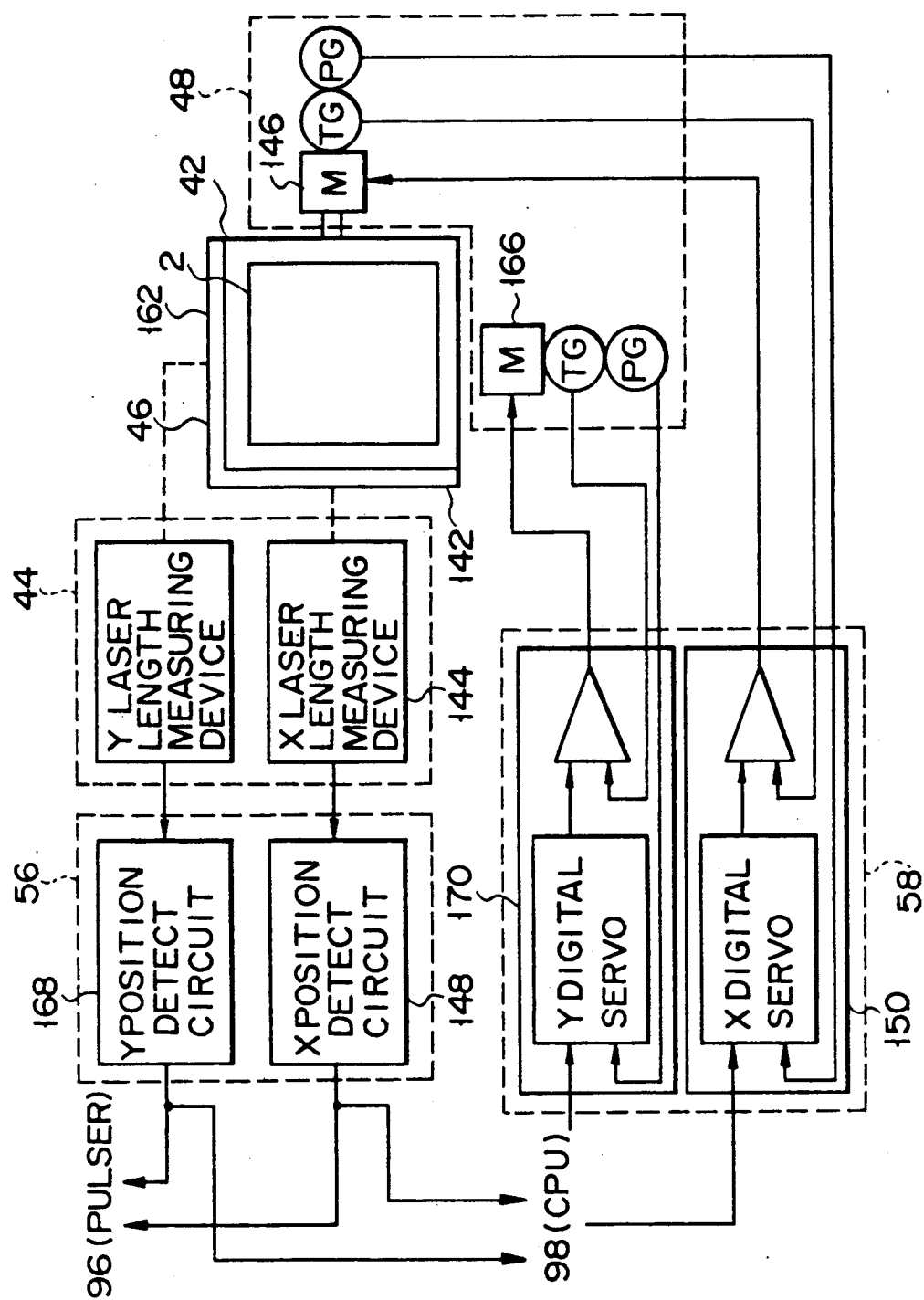
FIG. 4 is a schematic diagram illustrating the position measuring unit and the XY table control unit associated with the XY table of FIG. 1.

Referring to FIG. 4, mirror 46 mounted on table 42 on which sample 2 is placed has a mirror portion 142 whose normal extends in the direction of X axis and a mirror portion 162 whose normal extends in the direction of Y axis. Laser length measuring device 44 has an X-axis measuring system 144 adapted to measure distance in the X-axis direction and associated with X-axis mirror portion 142 and a Y-axis measuring system 164 adapted to measure distance in the direction of Y axis and associated with Y-axis mirror portion 162. The X- and Y-axis positions of sample 2 placed on table 42 are detected by the X and Y laser detecting systems 44 and the detected values are directed to X- and Y-axis position detecting circuits 148 and 168 of position measuring unit 56 to generate position signals so that the position of the table is measured. Table 42 is moved by table control unit 58 responsive to position measuring unit 56 to a position and at a speed specified by CPU 98. That is, table 42 is shifted by driving motor section 48 by operation section 150 for computing a controlled variable in the direction of X axis and operation section 170 for computing a controlled variable in the direction of the Y axis in table control unit 58. Operation units 150 and 170 each comprise a digital servo circuit and an amplifier. Motor section 48 has X and Y motors 146 and 166 adapted to drive the table in the directions of X and Y axes, respectively, so that table 42 may be shifted in any direction. A tachometer generator TG and a pulse generator PG are associated with each of motors 146 and 166.

The position signals generated by X- and Y-axis position detecting circuits 148 and 168 are read into CPU 98 and stored in internal registers (not shown). At the same time, the position signals are applied to pulser 96 and then output therefrom as sync signals to readout circuit 76 for turning blanking electrode 32 ON and OFF, which is placed in bit conversion unit 80, and deflection control unit 90 at intervals of 0.5 $\mu$m which, is the width of the minimum drawing dimensional unit corresponding to the size of the electron beam.

Assuming that $\lambda$ is the wavelength of a laser beam, the resolution of X- and Y-axis position detecting circuits used in position measuring unit 56 will be $\lambda/80$ or $\lambda/125$. Thus, for $\lambda = 0.63$ $\mu$m, about 0.008–0.005 $\mu$m. Hence, the position control of table 42 is carried out on the basis of a minimum unit of the position signals determined by the resolution of position detecting circuits 148 and 168, not the minimum drawing dimensional unit.

Figure 3:
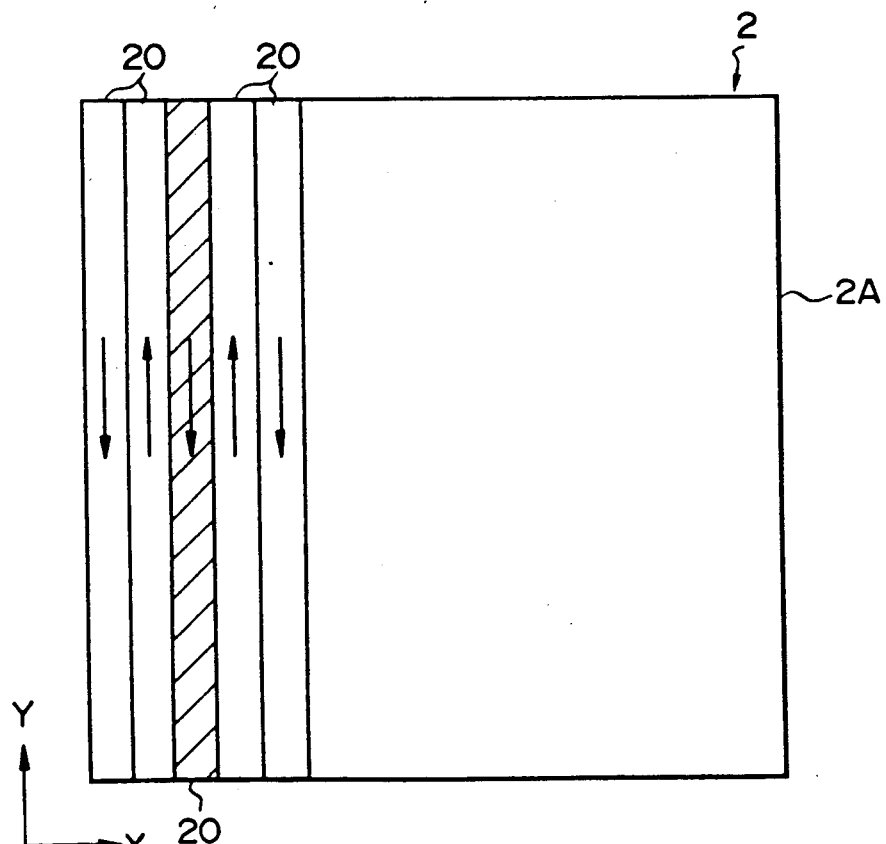
FIG. 3 illustrates a frame which is divided by electron beam scan width for drawing patterns on a sample.
Figure 5:
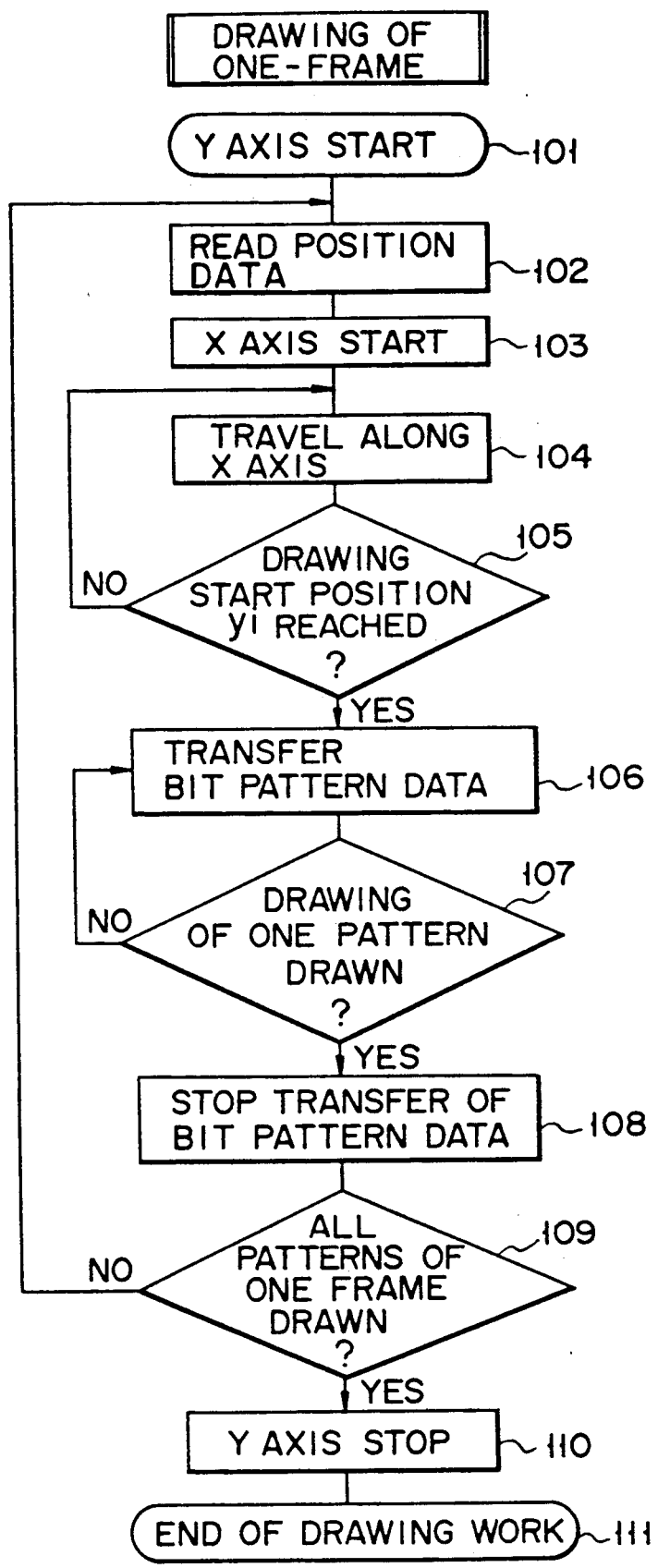
FIG. 5 is a flowchart for explaining the method of drawing patterns by using the lithography system of FIG. 1.
Figure 7:
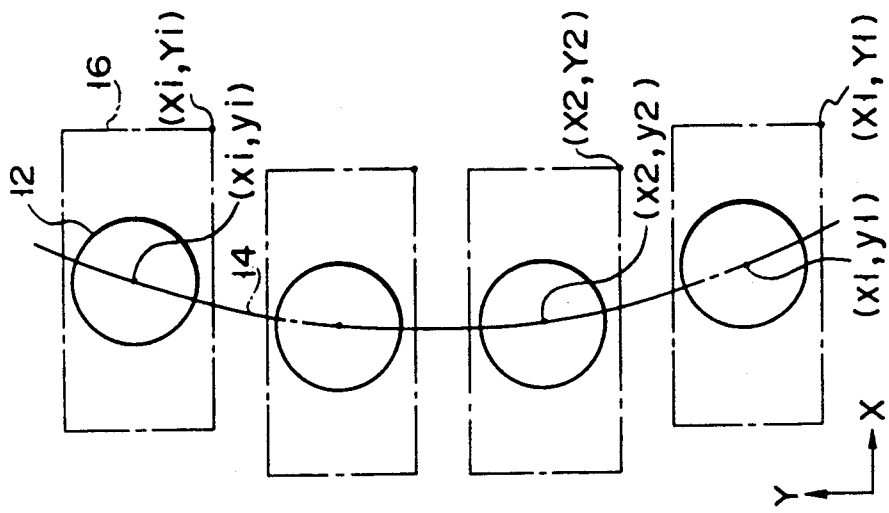
FIG. 7 is a diagram for explaining the method of drawing patterns on the sample.
Figure 6B:
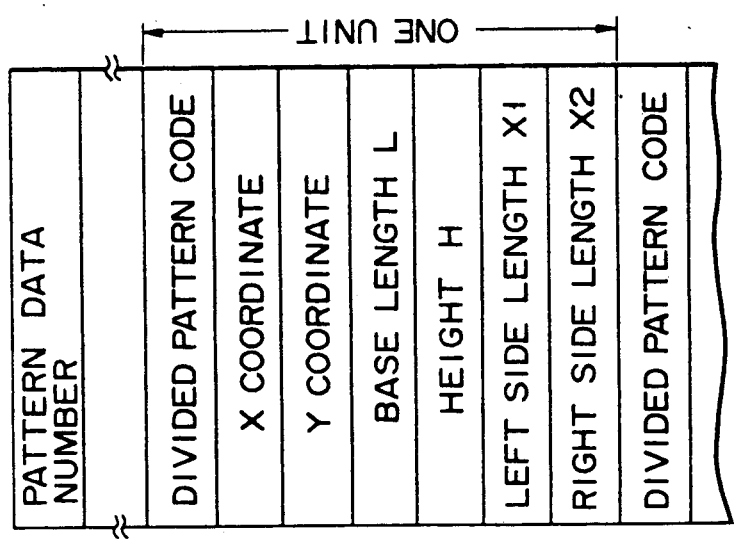
FIGS. 6A and 6B illustrate drawing data stored in an external storage device used for drawing patterns on the sample.
Figure 6A:
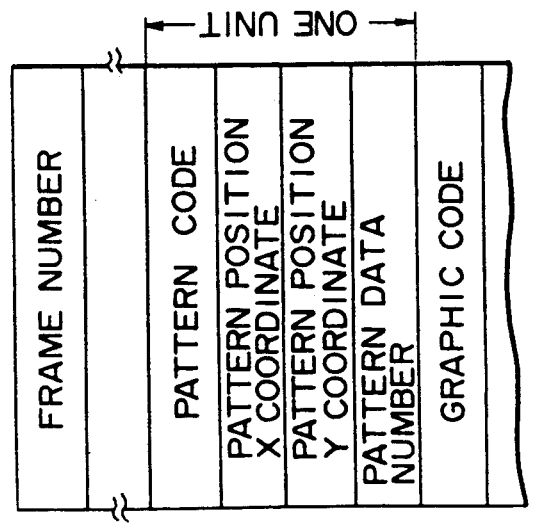

FIG. 5 shows a flowchart of the process of drawing frames 20 shown in FIG. 3 in accordance with the method of the present invention. In step 101 Y-axis motor 166 of FIG. 4 is driven first. As a result, table 42 moves in such a way that frame 20 indicated by oblique parallel lines in FIG. 3 moves toward the lower part of this Figure. In response to instructions from CPU 98 table 42 moves continuously at a speed suitable for drawing, during which time electron-beam optics 40 makes electron beam 24 to track frame 20 from its lower end to its upper end. At the end of step 101, electron beam 24 is intercepted by the cooperation of blanking electrode 32 and blanking plate 34. Next, in step 102, position data of one unit shown in FIG. 6A is read from storage device 92 into CPU 98 and then, in step 103, X-axis motor 146 is driven in accordance with the X-coordinate data of the pattern position data so that table 42 is moved by a predetermined amount in the direction of X axis. The movement in the direction of X axis is carried out before the drawing of a first pattern 12 within frame 20 is started. In step 105, then, a comparison is made between the Y-coordinate value of the position data and the position signal from Y-position detecting circuit 168 so as to decide whether the start position for drawing pattern 12 shown in FIG. 7 is reached or not. When the start position is reached, the pattern is drawn in step 106. As in the conventional raster scan method, the pattern is drawn by deflecting electron beam 24 while reading dot pattern data from dot pattern memory 70 in sync with sync signals from pulser 96. That is, since the pattern data for a pattern to be drawn has already been selected from among pattern data shown in FIG. 6B stored in storage device 92 in accordance with the pattern data number in the position data, read into bit conversion unit 80 for data conversion and then stored in dot pattern memory 70, the pattern can be drawn by reading the dot pattern data from dot pattern memory 70 in sync with sync signals from pulser 96 and providing it to blanking electrode 32 for turned ON and OFF electron beam 24. The pattern data of FIG. 6B represents the basic pattern in a predetermined format, and the divided pattern code represents a pattern type number when the basic pattern is divided into a plurality of pattern elements. The following "X coordinate" to "right side length x2" represent a pattern in such a tapezoidal format as shown in FIG. 11. Such a pattern is recorded as a unit for each of divided patterns. It is to be noted here that the X and Y coordinates are different from those of FIG. 6A. That is, the X and Y coordinates of FIG. 10A represent those within a pattern P on sample 2, while the X and Y coordinates of FIG. 6B correspond to those of dot pattern memory 70 of bit conversion memory shown in FIG. 2.

In step 107, the completion of drawing of one pattern 12 is monitored. In step 108, the transfer of bit pattern data is stopped and the emission of the electron beam is turned OFF at the sam time the drawing is completed in step 107. In step 109, a decision is made as to whether all the patterns 12 within one frame have been drawn. If all the patterns have not been drawn, step 12 is again carried out so that the position data of the next pattern code is read. Subsequently steps 102 to 108 are repeated to draw the remaining patterns 12. In this case, if the pattern data number remains unchanged, then bit conversion unit 80 carries out no data conversion and the dot pattern data previously stored in dot pattern memory 70 is used unchanged.

Figure 8:
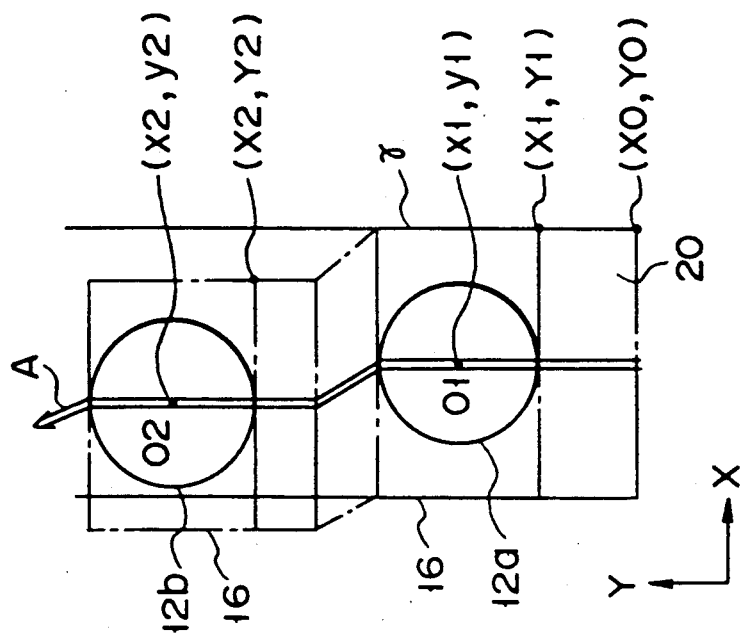
FIG. 8 is a diagram illustrating the manner in which patterns are drawn in accordance with the flowchart of FIG. 5.

In FIG. 8, there is illustrated the manner in which the patterns are drawn. That is, sample 2 divided into frames 20 is moved continuously in the direction of Y axis (downward in FIG. 8) with starting position at coordinates (X0, Y0). FIG. 8 shows a case where X1 of reference coordinates (X1, Y1) of a first pattern 12a is equal to X0. Hence, sample 2 is moved only in the direction of Y axis until the first pattern 12a is drawn completely, and a region 16, within which the one pattern 12 is to be drawn and which is partitioned by the minimum length unit of frame 20 of sample 2 in the direction of Y axis, agrees with frame 20 in the direction of its width. If a second pattern 12b has reference coordinates (X2, Y2) in which X2 is smaller than X1 for the first pattern 12a, then sample 2 will be moved to the right of FIG. 8 (i.e., table 42 is moved to the right) after the first pattern 12a has been drawn. Therefore, the locus A of the deflection center of electron beam 24 is curved to the left relative to sample 2 as shown in FIG. 8. Then, when the Y-axis position Y2 is reached, the drawing is started again so that the second pattern 12b is drawn. Third, fourth, . . . i-th patterns 12c, 12d . . . 12i are also drawn in sequence while shifting the locus of deflection center in accordance with X and Y coordinate data given as position data. When all the patterns 12 within one frame 20 are thus drawn, the movement of the table in the direction of Y axis is stopped in step 110 and then the pattern drawing work is completed in step 111.

Table 42 is moved accurately in the direction of X axis in accordance with compensation for X-axis position error of the electron beam to be described later and the movement is carried out in very fine units in accordance with the resolution of X-axis position detecting circuit 148. On the other hand, the movement in the Y-axis direction is controlled according to the minimum drawing dimensional unit corresponding to the beam size because of the relationship with the sync signals from pulser 96. However, by adding or subtracting fractions in the Y-axis position corresponding to the resolution of Y-axis position detecting circuit 168 to or from pulser 96 every time each of patterns 12 is drawn, it is also possible to move the table finely in the Y-axis direction as in the X-axis direction.

The above description is made of a case where the starting points (X1, Y1), (X2, Y2), etc. of patterns to be drawn are taken as reference positions and they are used as the values of X and Y coordinates of pattern position data. Alternatively, center positions (x1, y1), (x2, y2), etc. of patterns 12 may be used as the X and Y coordinate values of pattern positions to calculate the above coordinates (X1, Y1), (X2, Y2), etc. for drawing patterns.

Figure 9:
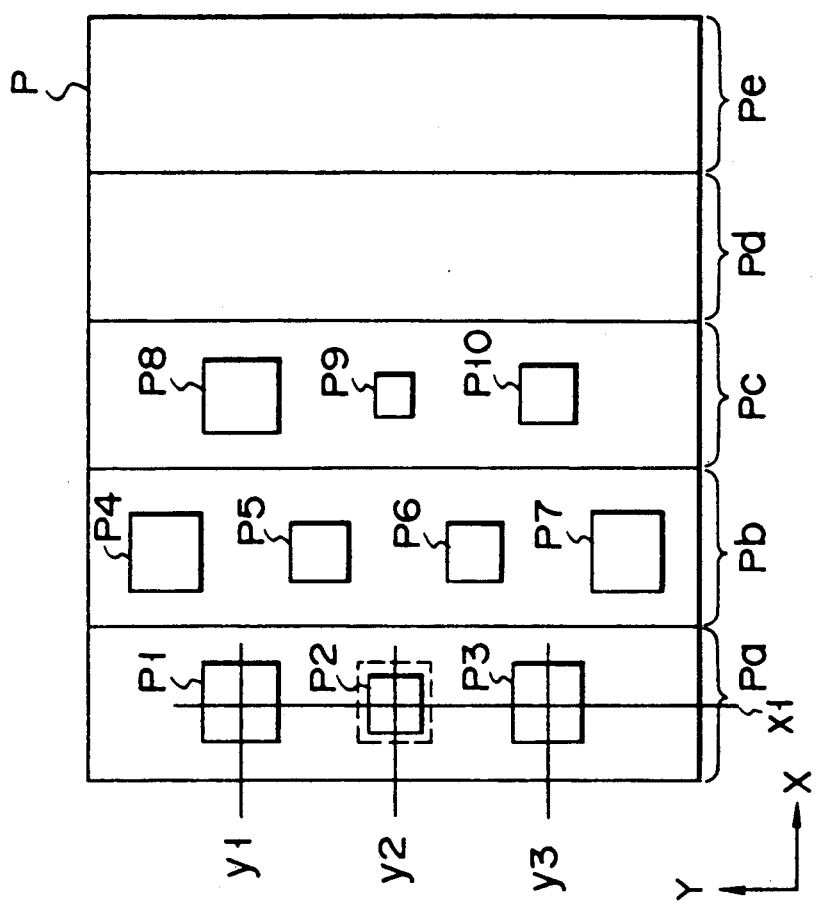
FIG. 9 illustrates drawing regions on the surface of the sample divided by the frames in a lithography method according to a second embodiment of the present invention.

FIG. 9 illustrates one example of division of a pattern P which is carried out in drawing patterns by a drawing method according to a second embodiment of the present invention. Pa, Pb, . . . designate frames resulting from dividing pattern P in the direction of X axis and are the same as frames 20. A plurality of patterns p1, p2, . . . are arrayed in each of frames Pa, Pb, . . . in such a way that they are not overlapped with respect to each other in the direction of Y axis. It is assumed here that patterns p1, p2, . . . are identical or similar to each other. It is further assumed that patterns p1, p2, . . . are arrayed along the center line in each of frames Pa, Pb, . . . only for the purpose of simplifying explanation.

FIGS. 10A and 10B show one example of drawing data for drawing pattern P. More specifically, FIG. 10A show position data while FIG. 10B shows pattern data. The position data shown in FIG. 10A is headed by a frame number (Pi) representing one of frames Pa, Pb, . . . of FIG. 9. Following the frame number (Pi), units of position data for patterns p1, p2 . . . to be arrayed within frame (Pi) are recorded in sequence. One unit of position data comprises the code of a pattern pi, the X and Y coordinate values xi and yi representing the position of pattern pi and a scale factor Si of enlargement or reduction of pattern pi relative to a basic pattern to be described later.

Figure 12B:
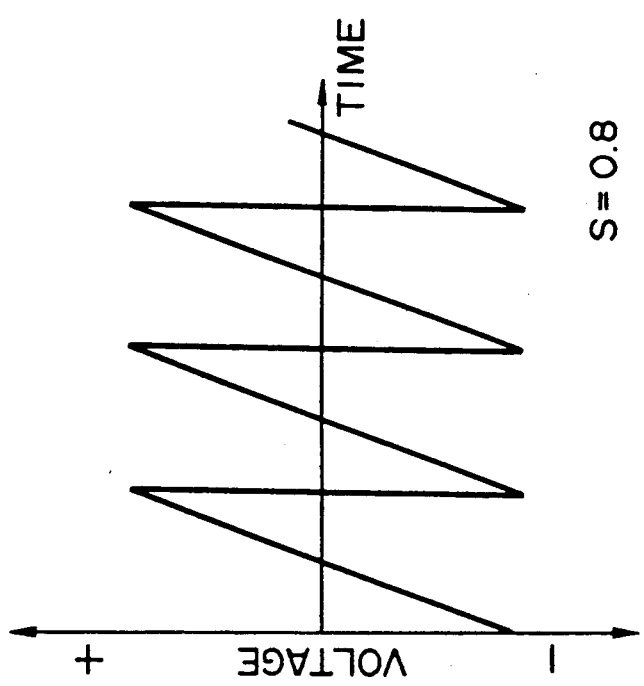
FIGS. 12A and 12B illustrate voltage waveforms for driving a deflecting electrode used for drawing patterns on the sample in accordance with the lithography method of the second embodiment of the present invention.
Figure 12A:
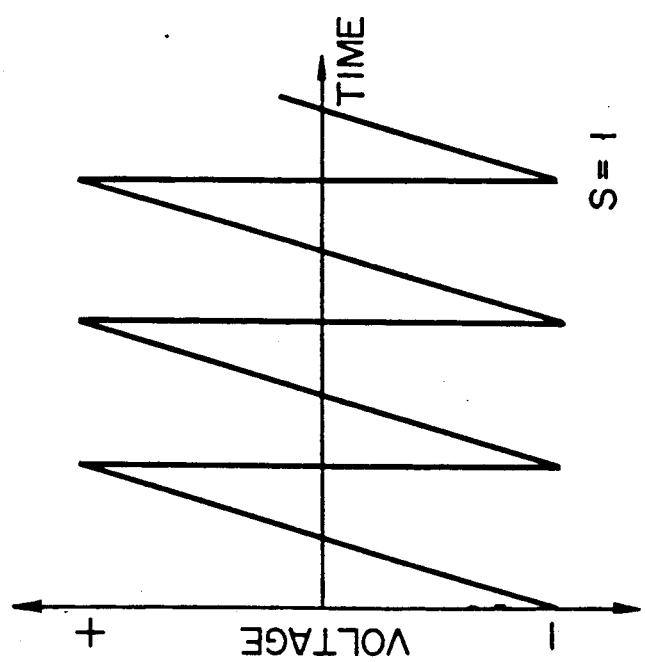
Figure 13B:
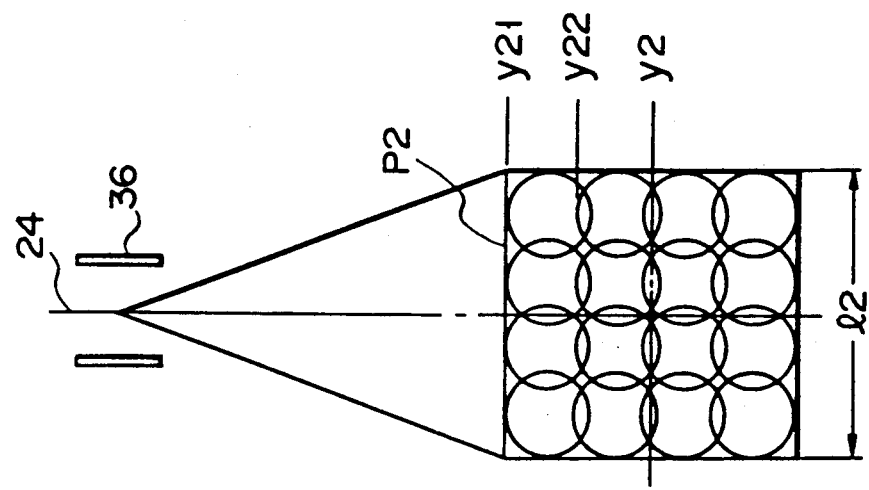
FIGS. 13A and 13B illustrate a method of enlarging or reducing patterns by using an electron beam directed onto the sample in the lithography method of the second embodiment of the present invention.
Figure 13A:
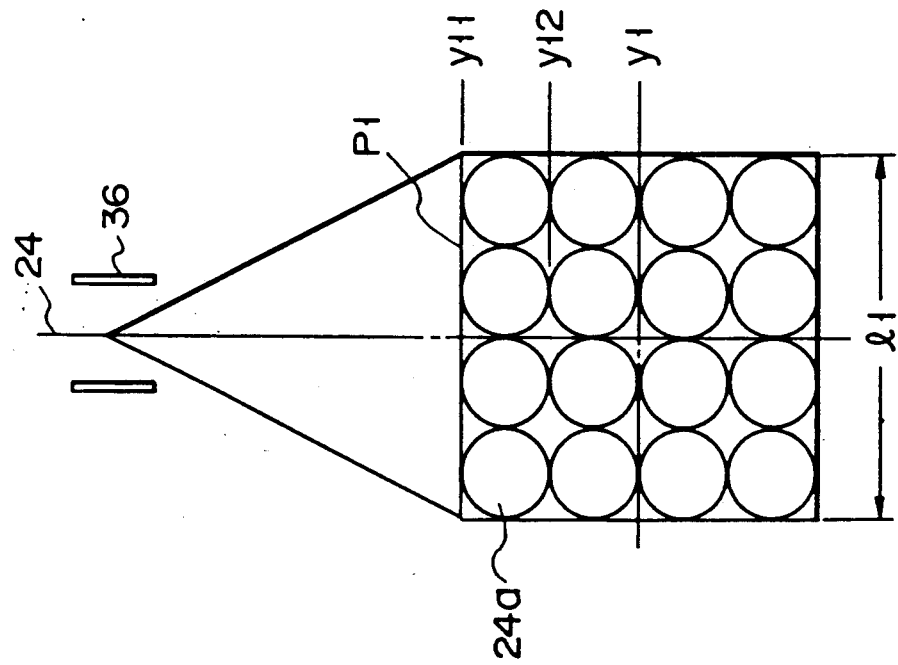

According to the second embodiment, a pattern is drawn in the following procedure. The drawing data comprising the position and pattern data show in FIGS. 10A and 10B are stored in external storage device 92 of FIG. 1 to draw patterns. The pattern data representing the basic pattern is read first by CPU 98 from external storage device 98 into bit conversion unit 80 for conversion to bit pattern data. At the same time, CPU 98 reads the position data stored in external storage device 92 in sequence in the order of frames Pa, Pb, . . . and provides command for moving table 42 to table control unit 58 so that patterns are drawn from the upper portion to the lower portion of frame Pa shown in FIG. 9. That is, table 42 is moved continuously from the lower portion to the upper portion of FIG. 9 with respect to the Y-axis direction while being positioned in the drawing position of frame Pa with respect to the X-axis direction. At this time the position of sample 2 placed on table 42 is detected by position measuring unit 56 of FIG. 4. Subsequently the scale (Si) of enlargement or reduction among the position data of FIG. 10A read into CPU 98 is fed from CPU 98 to deflection control unit 90 as a signal for setting a scan width. If the scale of enlargement or reduction for pattern p1 to be drawn first is 1, then the scan width remains unchanged so that such a sawtooth voltage having a predetermined amplitude as shown in FIG. 12A is applied to deflection electrode 36. At the same time, CPU 98 calculates the drawing start position for pattern p1 in the Y-axis direction and the scan interval in the Y-axis direction from the scale (S1=1) of enlargement or reduction for pattern p1, the pattern position Y coordinate (yi) in the position data and the pattern data shown in FIG. 10B and feeds a moving instruction into position measuring unit 56. Naturally the scan interval in the Y-axis direction remains unchanged when the scale of enlargement or reduction is 1 as described before. When the drawing start position for first pattern p1 is reached as a result of the continuous movement of sample 2 in the Y-axis direction, a deflection starting signal is fed from Y-axis position detecting circuit 168 to deflection control unit 90. At the same time, a signal for reading bit pattern data is applied to bit conversion unit 80 so that the drawing of pattern p1 is started. As in the conventional raster scan method, pattern p1 is drawn by causing blanking electrode 32 to turn electron beam ON and OFF in accordance with the bit pattern data while the electron beam is scanned. When pattern p1 is drawn, the position data for the next pattern p2 is read from external storage device 92 into CPU 98. When the enlargement or reduction scale S2 of pattern p2 is 0.8, CPU 98 feeds this value into deflection control unit 90 so that the amplitude of the scanning sawtooth voltage is changed according to the enlargement or reduction scale of S2=0.8. At the same time, position measuring unit 56 is fed by CPU 98 with a control instruction as to the drawing start position for pattern p2 on the Y axis and the scan width in the Y-axis direction calculated from the pattern position Y coordinate (y2), the pattern data shown in FIG. 10B and the enlargement or reduction scale (S2=0.8). FIG. 13B shows the drawing start position, the scan width and the dimension in the direction of scan for pattern p2 whose enlargement or reduction scale is S2=0.8. FIG. 13A shows the drawing start position, the scan width and the dimension in the scan direction for pattern p1 whose enlargement or reduction scale is S1=1. As shown in FIG. 13A, when the scale S of enlargement or reduction is 1, the drawing start position (y11), the scan spacing (y11-y12) and the scan width relating to the dimension l1 are determined with the diameter of circle 24a representing the size of electron beam 24a taken as a unit. However, when the scale S of enlargement or reduction is not 1, for example, when S=0.8 as before, the drawing start position (y21), the scan spacing (y21-y22) and the scan width are determined so that all the circles 24a shown in FIG. 13A may be contained within pattern p2 which is 0.8 times in area the pattern p1 as shown in FIG. 13B. In this case, the drawing start positions (y11), (y12) with respect to the centers (y1), (y2) of the patterns in the direction of Y axis and the dimensions (l1), (l2) of the patterns in the direction of scan are proportional to the scale S of enlargement or reduction. The scan spacing (y12-y11), (y21-y22) and the scan width are also approximately proportional to the scale S of enlargement or reduction, but a precise proportion will not be obtained because of no overlapping of electron beam spots in the circumference of pattern p2. After pattern p1 has been drawn in this manner, sample 2 is continuously moved in the direction of Y axis and when the drawing start position (y21) of pattern p2 is reached, the drawing of pattern P2 is started. At this point, the sawtooth voltage which determines the scan width of electron beam 24 is changed as shown in FIG. 12B and the scan spacing is also changed, with the result that 0.8 times reduced pattern p2 is drawn on the coordinates (x1, y2) (center coordinates) in pattern P as shown in FIG. 9. Then, patterns p3, p4, . . . are likewise drawn in sequence.

According to the present embodiment, patterns p1, p2 . . . are aligned with respect to the center line of each of frames P1, Pb . . . . They may be displaced with respect to the direction of X axis in FIG. 9. In this case, by shifting electron beam 24 in the direction of X axis by deflection control unit 90 or by changing the position of table 42 in the direction of X axis so that the relative positional relationship between sample 2 and electron beam 24 ma be changed in the direction of X axis in each of frames Pa, Pb . . . , it will become possible to draw patterns.

In the above embodiment, the pattern data for the basic pattern is prepared to the size of electron beam 24 as shown in FIG. 13A. Thus, if the basic pattern were enlarged, a gap would be produced between scans and the shortness of exposure would result. In practice, therefore, only reduction will be possible. As shown in FIG. 13B, however, by preparing the pattern data for the basic pattern previously with a dimension smaller than the size of electron beam 24 taken as a unit dimension, it will be possible to both enlarge and reduce the basic pattern.

Furthermore, the above embodiment has been explained with respect to a case where similar patterns are drawn enlarged or reduced at the same rate in the directions of X and Y axes. The enlargement or reduction may be carried out at different rates in the directions of X and Y axes. In addition, various modifications are possible. For example, several types of basic patterns may be prepared for selective use.

A third embodiment of the present invention will be described hereinafter.

The operation of bit conversion unit 80 shown in FIG. 2 will be detailed first. Drawing data for one frame read into data memory 72 are read into bit pattern converter 74 for each of cells C resulting from subdivision of frame 20 as indicated at 1−n and n−1 in FIG. 14. The pattern data for one cell is converted to bit pattern data for storage in pattern memory 70.

Figure 14:
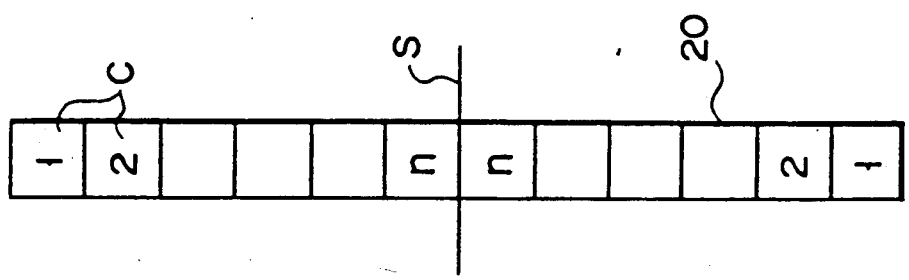
FIG. 14 illustrates cells resulting from subdividing a frame which has been divided by electron beam scan in a third embodiment of the present invention.

Pattern memory 70 is comprised of a plurality of memories (for example, four memories 62, 64, 66 and 68). For example, if bit pattern data for cell C1 of FIG. 14 is stored in pattern memory 68, then bit pattern data for successive cells C2 and C3 will be stored in pattern memories 66 and 64, respectively. The bit pattern data are read from pattern memory 70 in sequence. Bit pattern data for the next cell Ci is read into the pattern memory every time data for one cell is read out of pattern memory 70.

The bit pattern data stored in pattern memory 70 is reached, for example, in the position in which cell C1 is drawn, by movement of sample 2 along a Y axis of frame 20. Next, position measuring unit 56 feeds a readout instruction to readout circuit 76 so that the bit pattern data for cell C1 is sent from pattern memory 68 to blanking electrode driving circuit 78 adapted for turning blanking electrode 32 ON and OFF.

FIG. 15 is a conceptual diagram of the bit pattern data stored in pattern memory 70. That is, cell C is subdivided into units of 512 rows and 512 columns, each unit being assigned either 1 or 0. Each unit of 1 is adapted to irradiate sample 2 with electron beam 24, while each unit of 0 is adapted to cut the beam off. The bit pattern data in pattern memory 70 are read from the upper row to the lower row and from the left to the right in each row in a case where frame 20 is drawn in the forward direction from the top to the bottom in FIG. 3. In a case where the frame is drawn in the reverse direction from the bottom to the top, on the other hand, the bit pattern data are read from the lower row to the upper row and from the left to the right in each row. According to the conventional drawing methods, drawing data were needed for all the cells C1 to Cn and Cn to C1 in one frame. According to the present embodiment, drawing data have only to be prepared for the upper half cells C1 to Cn alone, and drawing data for the lower half cells Cn to C1 may be omitted. In practice, if drawing pattern P is line symmetric with respect to the horizontal center line S of pattern drawing region 2A as shown in FIG. 16, drawing data may be prepared only for the upper half of pattern drawing region 2A. That is, drawing data may be prepared for cells C1 to Cn of FIG. 14, or the upper half of each of frames 20 shown in FIG. 3. The drawing data prepared for the upper half is stored in external storage device 92. In drawing patterns, as in the usual pattern drawing methods, drawing data corresponding to cells C1 to Cn of frame 20 are read from external storage device 92 into data memory 72 before drawing is started in frame 20. After the conversion to bit pattern data is completed for the last cell Cn of the upper half of FIG. 14, the drawing data for the cell Cn is read again from data memory 72 into bit pattern converter 74, which is again converted to bit pattern data and stored in pattern memory 70. Reading into pattern memory 70 is the same as in the usual drawing method. After the second data conversion for cell Cn is thus completed, data conversion is sequentially carried out for the remaining cells from cell Cn−1 up to cell C1 and the bit pattern data therefor are stored in pattern memory 70 in sequence. Reading the bit pattern data from pattern memory 70 is effected from the upper row to the lower row and from the left to the right in each row in FIG. 15 while patterns for the upper half cells C1 to Cn in FIG. 14 are being drawn. On the other hand, the bit pattern data for cells Cn to C1 resulting from the second data conversion are read from the lower row to the upper row and from left to right in each row in FIG. 15. The drawing data representing cells Cn to C1 at the lower half of FIG. 14 ar read following data for cells C1 to Cn of the upper half. Therefore, the pattern represented by cells C1 to Cn of the upper half of FIG. 14 is drawn on cells Cn to C1 of the lower half symmetrically with respect to axis S between cells Cn, Cn. The entire region of pattern P inclusive of the lower half can be drawn only by the use of the drawing data for the upper half above the symmetry axis S.

In the present embodiment, a description is made, as can be seen from FIGS. 15 and 16, of the horizontal symmetry axis S, that is, a case where the upper and lower halves of each frame 20 of FIG. 3 are symmetrical with respect to axis S. The present invention may be applied to a case where the left and right halves of pattern P are symmetrical with respect to vertical line T indicated in dotted line as shown in FIG. 16. In this case, when drawing data are read from external storage device 92 into data memory 72 for each of frames 20, the drawing data corresponding to each of frames 20 are read into memory 72 again with the symmetry axis taken as a boundary, and the bit pattern data are read from pattern memory 70 from right to left.

If stripe 20 is symmetrical with respect to vertical and horizontal lines, the above two approaches can be combined so that the amount of drawing data is reduced to $\frac{1}{4}$. In addition, even if the line symmetry repeatedly appears vertically or horizontally, the same processing can be applied. In this case, reading data into the data memory or reading data from the pattern memory is indicated by CPU 98.

In the above embodiment, when pattern is drawn on the lower half cells Cn to C1 using drawing data for the upper half cells C1 to Cn of FIG. 14, the order of reading from pattern memory 70 is reversed in order to reverse the pattern in cells Cn to C1. Alternatively, the drawing data read from data memory 72 into bit pattern converter 74 may be changed to vertically symmetrical data before conversion to bit pattern data. In this case, reading from pattern memory 70 may be carried out as usual. That is, to reverse the top and bottom of pattern Pa shown in FIG. 11, the drawing data has only to be modified as follows.

$$X \longrightarrow X \quad Y \longrightarrow 512 - Y \quad H \longrightarrow -H$$
$$X1 \longrightarrow X1 \quad X2 \longrightarrow X2$$

Here 512 represents a value corresponding to the length of one cell in the direction of Y axis, that is, the number of rows in FIG. 15.

FIG. 17 illustrates a fourth embodiment of the present invention. In the first embodiment, each pattern 12 is drawn with respect to its X-axis direction by movement of table 42 in the X-axis direction. According to the present invention, pattern 12 in frame 20 is drawn by movement of table 42 for its Y-axis direction but by deflection of electron beam 24 for its X-axis direction. In FIG. 17 the same unit as deflection control unit 90 shown in FIG. 1 is illustrated specifically. That is, deflection unit 90 is a fundamental part for deflecting electron beam 24 for scanning and thus produces sawtooth waves. Signals concerning deflection width data are applied from CPU 98 to a deflection width digital to analog converter (hereinafter referred to as a deflection width DAC) 82. The signal from DAC 82 is supplied to a sawtooth generator 84a of an operation section 84 which comprises sawtooth generator 84a, adder 84b and amplifier 84c, and a voltage waveform for a deflection of a predetermined width for a predetermined time is formed, thus producing such sawtooth waves as shown in FIG. 12A. A deflection start position DAC 86 is supplied with data relating to a deflecting start position in X axis direction, which data determines the drawing start position in each scan in the X-axis direction. The position compensating signal from deflection start position DAC 86 is applied to the adder of operation section 84 to change the offset of the sawtooth waves. A curvature control DAC 88 for converting a digital signal for controlling a curvature to an analog signal is provided to implementing the present invention, which provides a compensating value corresponding to the X-axis position of pattern 12 to be drawn, i.e., the X-coordinate value of pattern position in the position data of FIG. 6A. The compensating value is also applied to the adder to cause the sawtooth waves to go up and down along with the output of deflection start position DAC 86. Since the resolution of a deflecting system formed of deflecting start position DAC 86 and curvature control DAC 88 is normally approximate 0.01 μm, the drawing position can be controlled with high accuracy. Since the range of variation of the position in the X-axis direction produced by the deflection of electron beam 24 is not very large, the present embodiment may be combined with the first embodiment.

With the present embodiment, electron beam 24 is deflected in the direction of X axis by curvature control DAC 88. By deflecting electron beam 24 in the direction of Y axis as well, it becomes possible to vary the Y-axis position of each pattern 12. That is, by deflecting electron beam 24 in the direction of Y axis at a time of drawing of each pattern 12 the drawing position can be changed. This is suited to an adjustment of a fractional portion which is smaller than a scan spacing corresponding to the width of electron beam 24.

In the present embodiment described previously, table 42 is continuously moved in the direction of Y axis. Alternatively, to draw patterns, electron beam 24 may be scanned in the directions of X and Y axes with the optical axis of electron beam 24 positioned substantially in the center of each pattern 12. According to this approach, by combining positioning of table 42 and compensating for resultant positioning errors as being resulted from changes in the position of electron beam 24 in the X and Y axis directions, it becomes possible to position control an array of patterns 12 in the directions of X and Y axis directions with great accuracy, inclusive of control a fraction of the minimum drawing dimensional unit.

Figure 18:
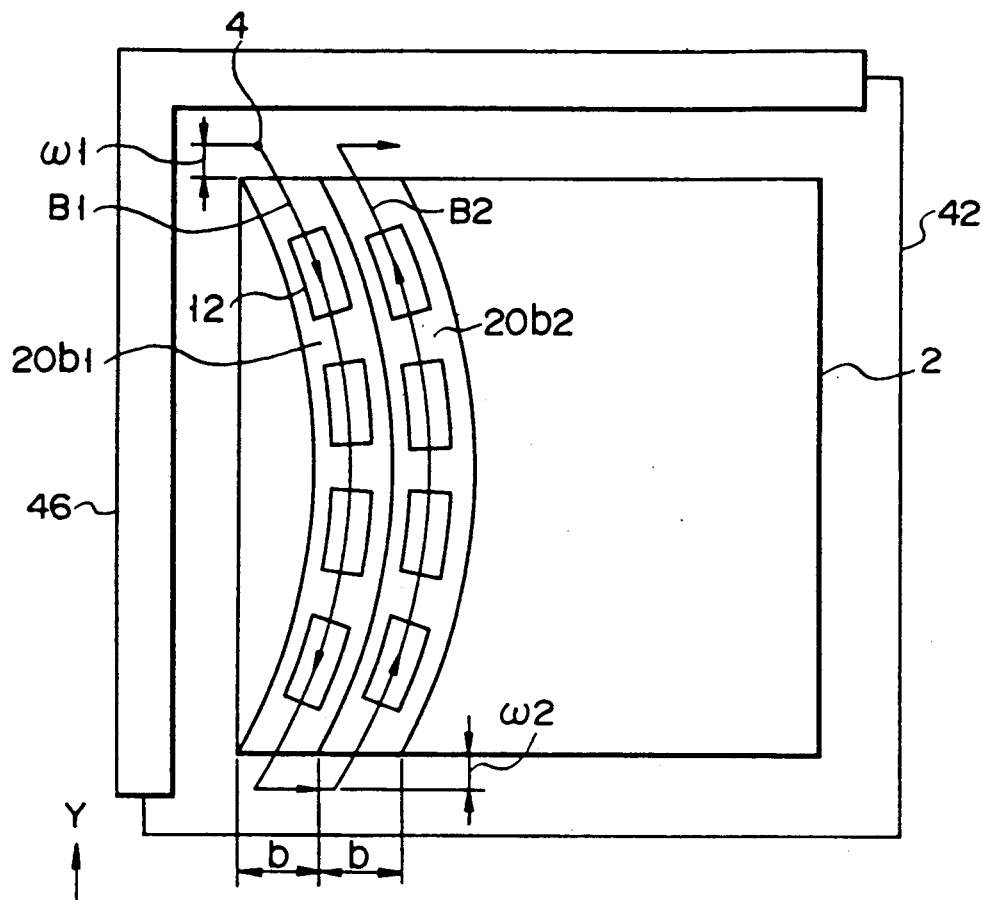
FIG. 18 is a diagram illustrating a method of dividing a pattern in a fifth embodiment of the present invention.
Figure 20:
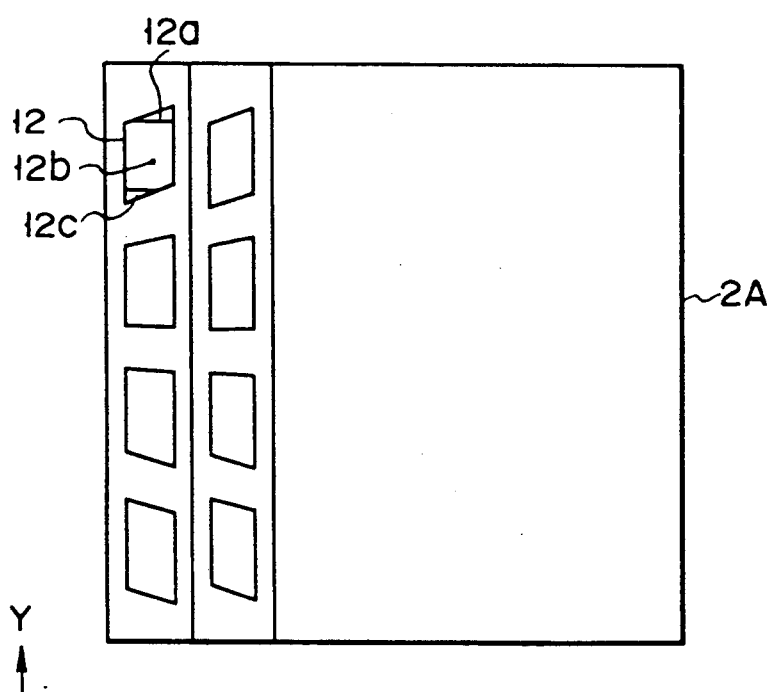
FIG. 20 illustrates an imaginary state of patterns obtained through a modification of the patterns using drawing data according to a drawing method of the fifth embodiment of the present invention.
Figure 19:
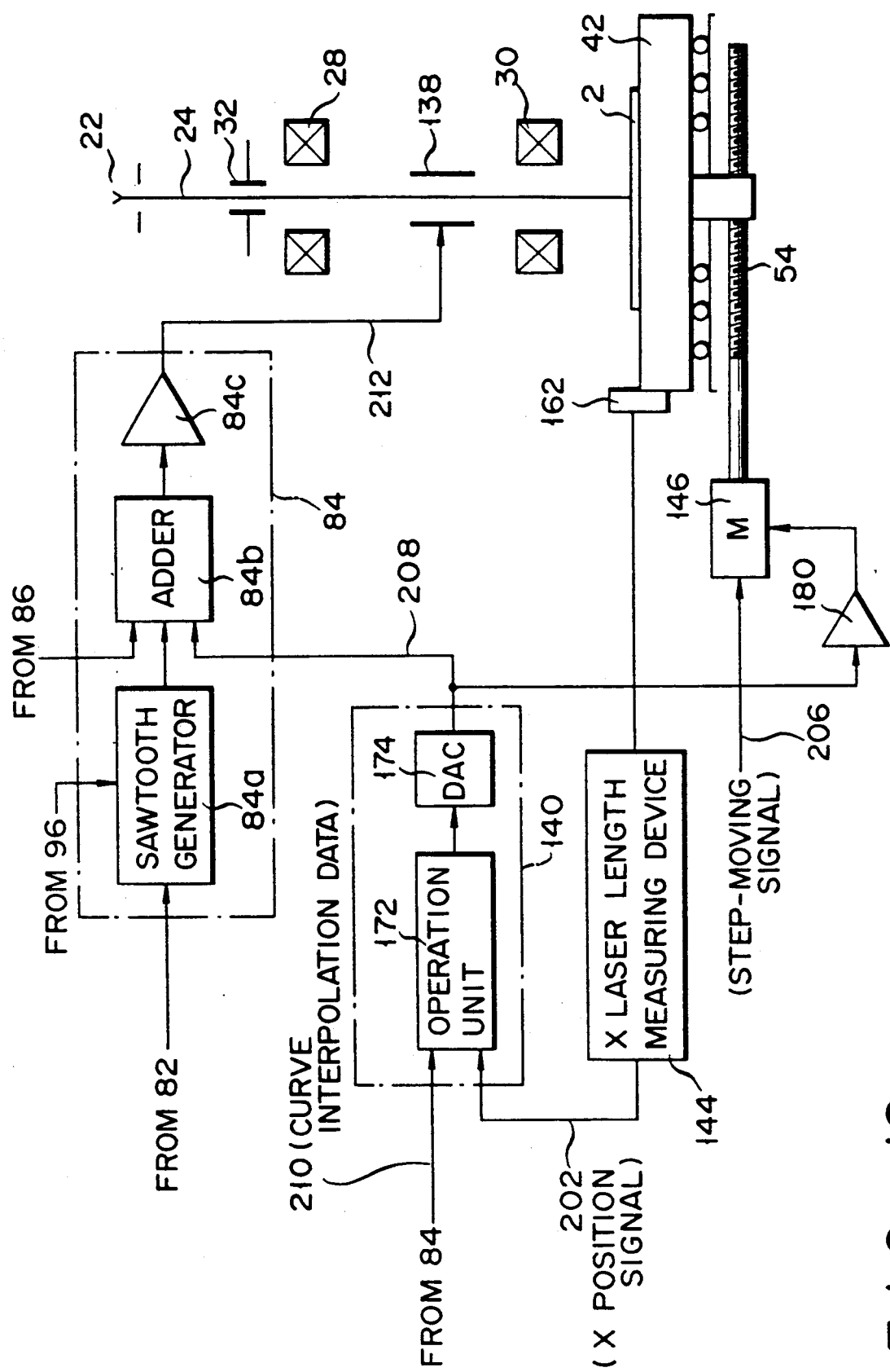
FIG. 19 is a block diagram of a device for controlling the deflection of an electron beam in the X direction in the fifth embodiment of the present invention.
Figures 25A, 25B:
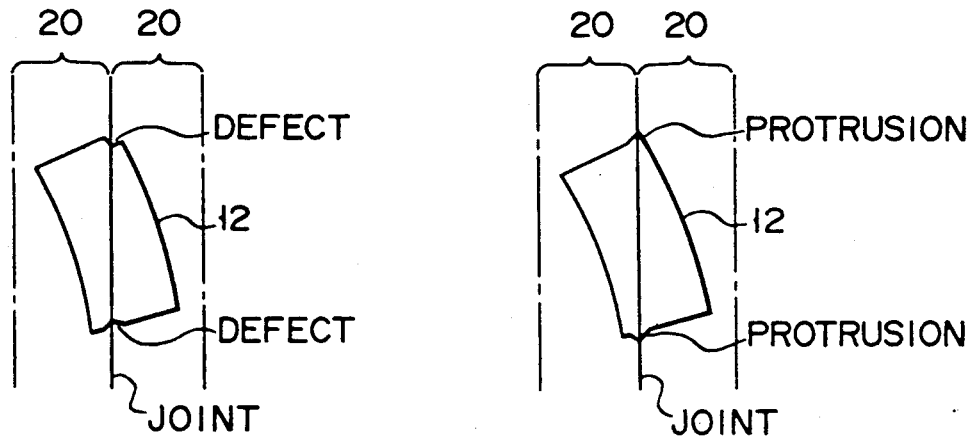
FIGS. 25A and 25B illustrate patterns drawn by those methods other than the fifth embodiment of FIG. 18.

A fifth method of the invention will now be described. In this embodiment, electron beam 24 is moved, with the center of its scan width moving along curve B1 from point 4, as is shown in FIG. 18, thereby to draw patterns 12 arrayed along curve B1. The fifth method is carried out by the device a part of which is shown in FIG. 19. Before moving table 42, CPU 98 supplies operation unit 172 with the data representing scanning frequency (i.e., number n of basic scanning lines), the data AS (i.e., f n × AS, where AS is the address size, or the interval between the scanning lines), and the data (ΔXi) for interpolating curve B1 in the X-axis direction, which corresponds to the Y-axis pitch i). The X-axis ordinate of point 4 is incremented by ΔXi every time table 42 is moved in the Y-axis direction by the distance of n × AS × i, thereby interpolating curve B1. Operation unit 172 determines the difference between the incremented X-axis ordinate of point 4 and the value of signal 202 output by X-axis length measuring device 144 and representing the position of table 42. The data showing this difference is input to DAC 174 and converted into an analog signal 208 which represents the distance which table 42 has moved in the X-axis direction. This analog signal 208 is input to adder 84b, not to curvature control DAC 88 (FIG. 17). The output signal of adder 84b is amplified by amplifier 84c and then supplied to deflection electrodes 138, whereby electron beam 24 is deflected in the X-axis direction. In the meantime, signal 208 is amplified by power amplifier 180 and supplied to motor M. Motor M moves table 42 in the X-axis direction so as to reduce the value of signal 208. Hence, electron beam 24 is shifted on sample 2 along curved line B1 by a combination of the movement of electron beam 24 in the direction of X axis by deflector 138 and the movement of table 42 in the direction of X axis by X motor 146, which are carried out by curve interpolation signal 210. When electron beam 24 faces a drawing region as a result of the shift of table 42 in the direction of Y axis, and blanking electrode 32 is turned ON and OFF by drawing data so that a pattern is drawn. When table 42 reaches the end of its continuously movable range in the Y-axis direction, X motor 146 is supplied with a step driving signal 206 so that table 42 is moved by width b to the left in FIGS. 18 and 19 and a pattern is drawn in second frame 20b2. It is to be noted here that patterns 12 are arrayed along curved line B1 and the shape of each of the patterns is also parallel to line B1 as shown in FIG. 18. However, since the X-axis relative position of electron beam 24 and sample 2 varies along curved line B1, the positional variations of patterns 12 in the X-axis direction corresponding to those of curved line B1 are canceled out so that patterns 12 shown in FIG. 18 are represented as shown in FIG. 20 from the viewpoint of drawing data. That is, patterns 12 are arrayed parallel to the Y axis, have no curvature parallel to curved line B1 and are represented as parallelograms extending in the direction of Y axis. Hence the position data for each pattern may be simplified and the pattern data of the tapezoidal format may be represented by a combination of only three patterns 12a, 12b and 12c shown in the upper left of FIG. 20. Moreover, drawn patterns will have accurate forms parallel to curved line B1 as shown in FIG. 18. If patterns 12 arrayed on a line as shown in FIG. 20 have substantially the same form, for example, a round form, pattern data is prepared only for one pattern and used repeatedly for patterns with different position data. Further, since patterns 12 are drawn in sequence within curved frame 20b1 as table 42 shifts continuously in the direction of Y axis, such defects and protrusions which will occur whenever pattern 12 is divided by a seamed line of adjacent frames as shown in FIGS. 25A and 25B will never be produced at a seamed line of adjacent frames. The above explanation is made of a case where so-called approach paths ω1, ω2 of electron beam 24 outside of sample 2 are made parallel to curved lines B1, B2 . . . The paths are adapted to obtain stable movement of table 42 in the Y-axis direction at a predetermined speed which is not necessary for the drawing. Hence, needless to say, the curve interpolation for the approach paths may be omitted in whole or in part.

Figure 21:
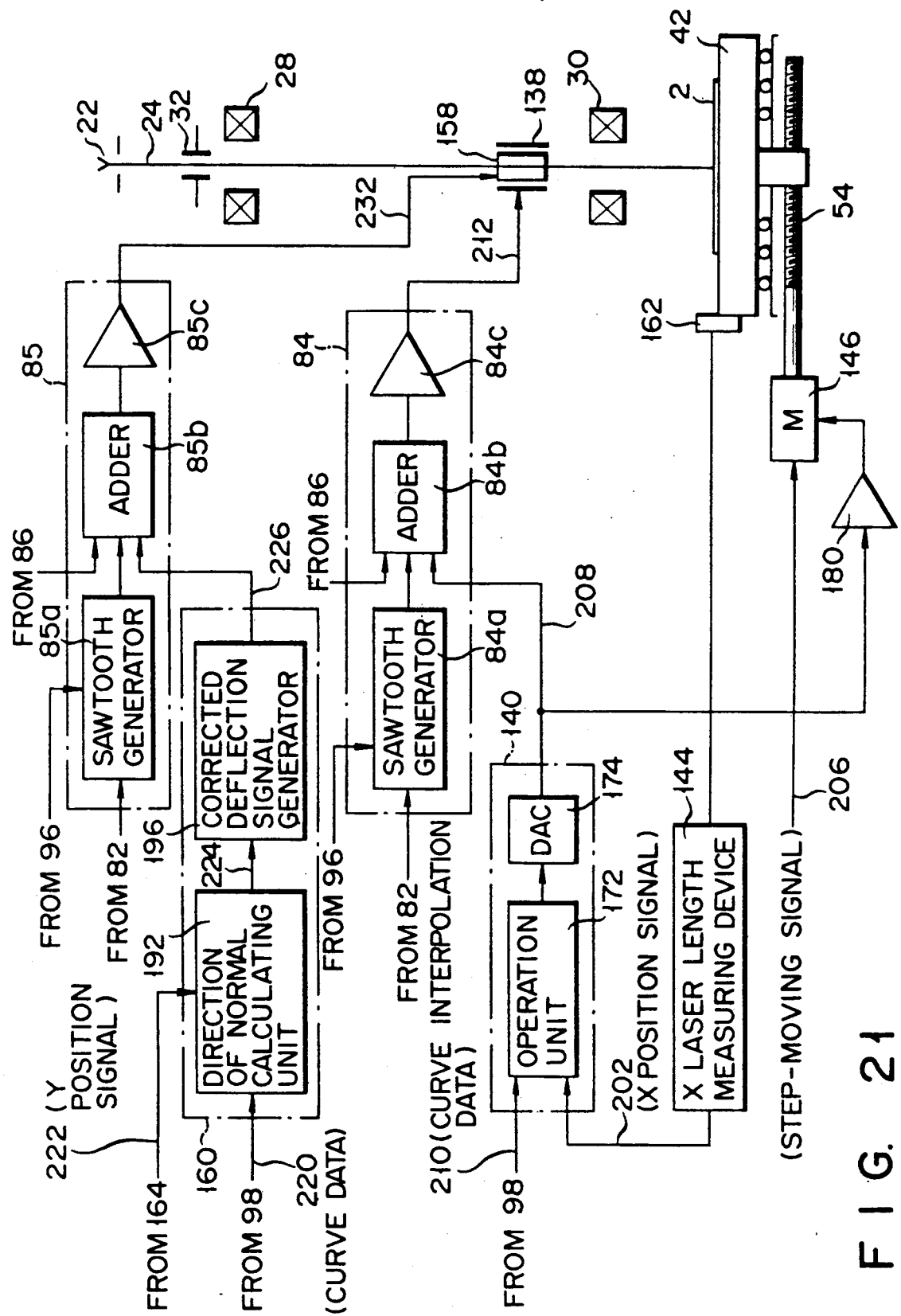
FIG. 21 is a block diagram of a device for controlling the deflection of the electron beam in the Y direction, which is added to the fifth embodiment of FIG. 19.
Figure 22:
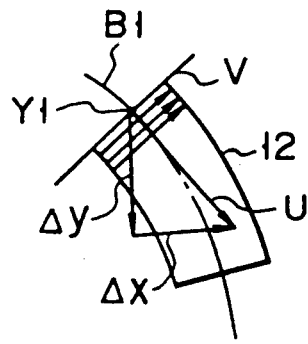
FIG. 22 illustrates a scanning condition of an electron beam when drawing patterns using the fifth embodiment in FIG. 21.

FIGS. 21 and 22 illustrate a sixth embodiment of the present invention. Curved-line data 220 representing curved lines B1, B2 shown in FIG. 18 is applied to a unit 192 for calculating a correction amount in the Y-axis direction, and calculation is then made of a tangent U, for example, at point Y1 on curved line B1 which is being irradiated with electron beam 24, from X, Y change rates Δx, Δy of curved line data 220 at point Y1 in accordance with Y-axis position signal 222 from Y-axis length measuring device 164 (referred to FIG. 4). Further, the direction of normal V at Y1 on curved line B1 is calculated from the tangent U to obtain the direction of normal V. A signal 224 which representing the direction of normal V is input to a Y-axis corrected deflection signal generator 196 adapted for generating a Y-axis corrected deflection signal and a Y-axis corrected deflection signal 226 is applied to an operational amplifier 198 in sync with X-axis deflection signal 208. A Y-axis sawtooth generator 85a supplies to operational adder 85b a Y-axis deflection signal 228 (for cancelling the movement of table 42 in Y axis direction to perform parallel scan with respect to the X axis) corresponding to the position of table 42 in the direction of Y axis, which is excluded from the explanation of the fifth embodiment, in sync with X-axis deflection signal 208. The Y-axis deflection signal 232 comprising Y axis moving signal 226 and Y axis deflection signal 228 is applied to Y-axis deflector 158. As a result, the direction in which electron beam 24 is deflected on sample 2 agrees with the direction of normal V shown in FIG. 22. That is, electron beam 24 having a minimum drawing dimensional unit b of frames 20b1, 20b2, is scanned in the direction of normal V at each point on curved lines B1, B2, . . . so that patterns 12 are represented as rectangles extending in the direction of Y axis, not as parallelograms from the viewpoint of drawing data. For this reason, it becomes possible to process each of patterns 12 as a single pattern, not as a combination of three patterns 12a, 12b and 12c as shown in FIG. 20. The patterns can thus been drawn more readily and more accurately.

Figure 23:
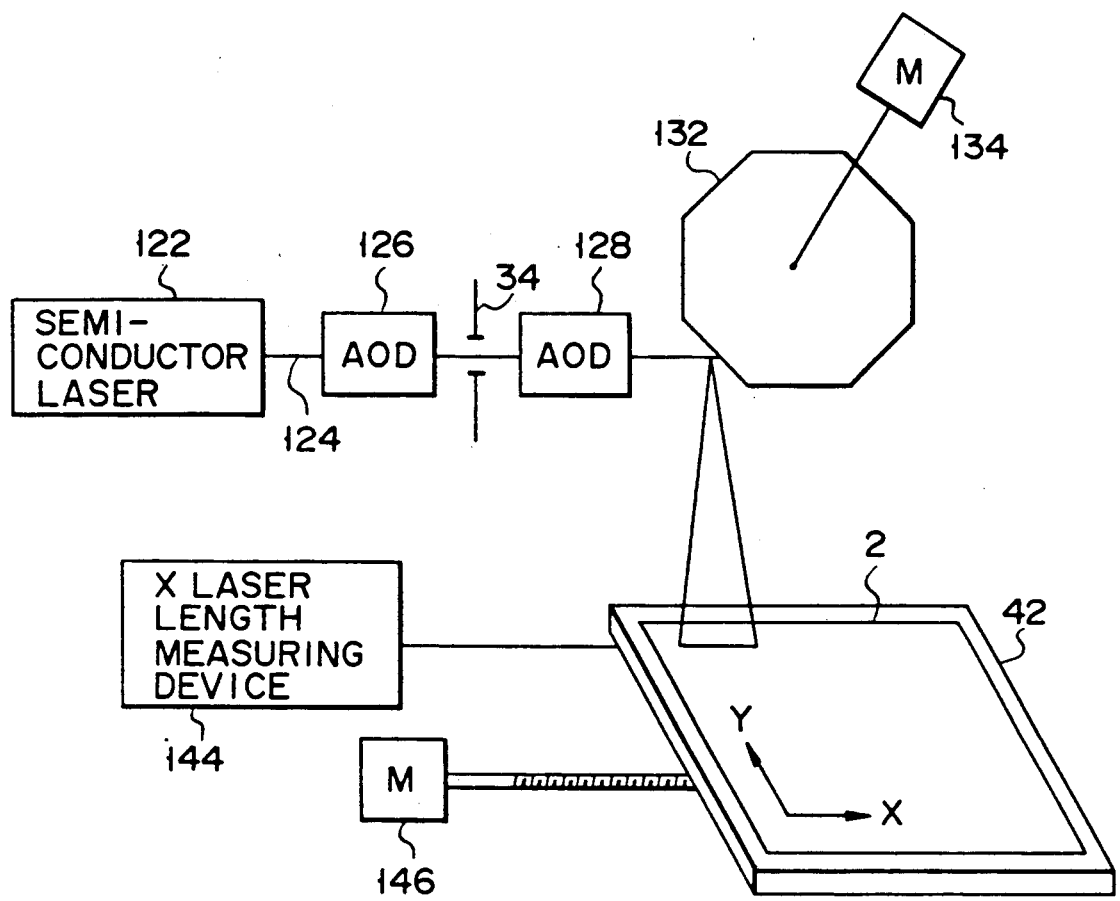

FIG. 23 is a schematic diagram of a raster-scan laser-beam drawing system incorporating the present invention. The system includes a semiconductor laser 122 for emitting an energy beam or a laser beam 124, an acoustic optical system (AOD) 126 for blanking laser beam 124 in accordance with drawing data, a blanking 34 having an opening an AOD 128 for shifting an area (position) of sample 2, that is irradiated with laser beam 124, in the direction of X axis, a polygon mirror 132 for scanning laser beam 124 in the direction of X axis by a predetermined width and a driving motor 134 for polygon mirror 132. Sample 2 is placed on table 42 which is movable and controllable in position. With this system, curve interpolation signal 210 is applied to AOD 128 and X motor 146 so that patterns are drawn in accordance with the methods of the fifth and sixth embodiments.

Figure 24:
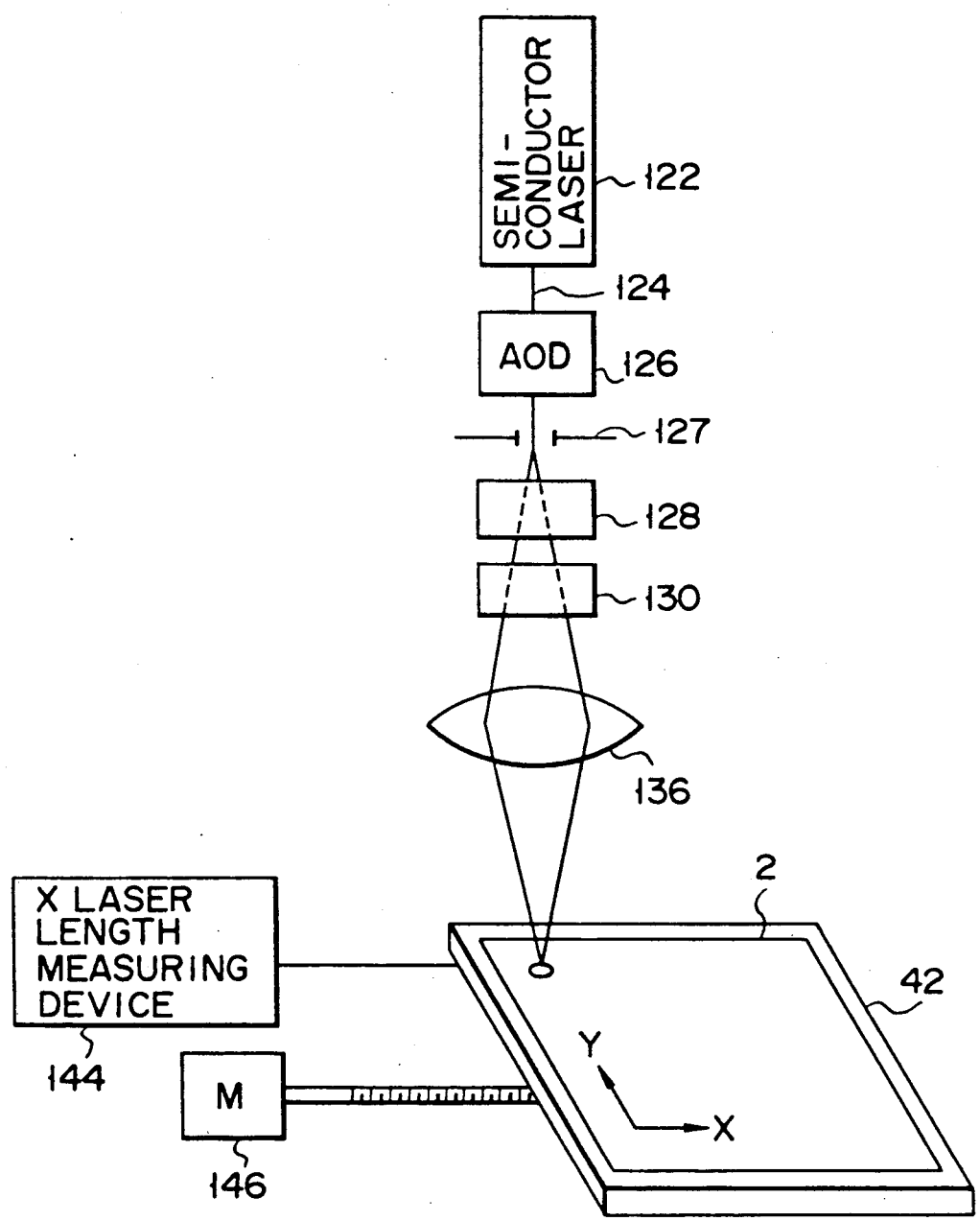
FIGS. 23 and 24 illustrate lithography systems using a laser beam and incorporating the present invention.

FIG. 24 schematically illustrates a drawing system using a shaped beam. The same parts as those in FIG. 23 are designated by the same reference characters. Laser beam 124 transmitted through blanking aperture 127 which having an opening of the same form as pattern to drawn on sample 2 imaged on sample 2 by an image forming lens 136. According to the system, a pattern of a predetermined form, for example, a round form, provided by blanking aperture 127 is drawn enlarged or reduced as needed on a curved line corresponding to curved line B1, B2 shown in FIG. 18. Blanking AOD 126 is turned ON and OFF in accordance with the Y coordinate of the position data of a pattern to be drawn and Y-axis position of table 42 to allow laser beam 124 to pass therethrough for a predetermined time for each of patterns. AOD 130 deflects laser beam 124 in a predetermined position on sample 2 while laser beam 124 passes through blanking AOD 126. Laser beam 124 is shifted in the Y-axis direction on sample 2 at a speed equal to a travel speed of table 42 in the Y-axis direction by AOD 130 synchronized with AOD 126. In this system, by applying curve interpolation signal 210 to AOD 128 and X motor 146, patterns are drawn in a predetermined array on curved lines corresponding to curved lines B1, B2 shown in FIG. 18. In the previous embodiment, areas (positions) of sample 2 which are irradiated with laser beam 124 in the X-axis direction or the second direction vary in accordance with curved lines B1, B2. Hence, in order for patterns to be drawn, laser beam 124 may be deflected and/or table 42 may be shifted.

The present invention may be applied to drawing systems using various types of electromagnetic radiation such as electron beam, laser beam, ion beam or the like. The drawing method need not be restricted to the raster scan method, and various methods may be adopted.

What is claimed is:

1. A method of drawing a plurality of arrayed patterns using a raster-scan energy-beam drawing system comprising the steps of:

determining a raster scan width so that each of said arrayed patterns may be kept within the raster scan width;

inputting pattern data and position data, wherein said position data is representative of a minimum position-determining unit of said energy beam and wherein said input pattern and said position data represent the configuration and position of each of said pattern, respectively, into said energy-beam drawing system;

changing in accordance with the position data the relative position between a substrate and said energy beam with respect to a direction in which said energy beam is scanned before drawing of each of the patterns is started; and drawing patterns in accordance with the pattern data while controlling in accordance with the position data the relative position between the sample and said energy beam with respect to a direction normal to the scanning direction so as to have the relative position coincide with the drawing position of each pattern.

2. A method according to claim 1, wherein, when the position data contains a fraction smaller than a minimum drawing dimensional unit defined by the size of the energy beam in a direction normal to the scan direction, the position data is given by varying the relative position of the sample and the energy beam in the direction normal to the scan direction by the fraction.

3. A method of drawing pattern in which a plurality of patterns are arrayed enlarged or reduced with respect to a basic pattern in at least one of directions of X and Y axes, comprising the steps of:

supplying a drawing system with pattern data representing the basic pattern and position data including positions of the patterns and scales of enlargement or reduction with respect to the basic pattern;

controlling a position in which drawing of each of the patterns is started, and controlling a scan width and scan spacing of an energy beam in accordance with the position data; and turning the energy beam ON and OFF in accordance with the pattern data.

4. A method of drawing pattern including arranged patterns symmetrically with respect to an axis by use of an energy beam, comprising the steps of:

supplying an energy beam drawing system with drawing data for pattern on only one side of the axis of symmetry;

drawing the pattern on the one only side of the axis of symmetry in accordance with the drawing data; and modifying the supply order of the drawing data during a time period from readout to drawing of the drawing data such that the other pattern to be drawn on the opposite side of the axis of symmetry will be symmetric with respect to the axis of symmetry when drawing the other pattern on the opposite side of the axis of symmetry.

5. A method according to claim 4, wherein in a drawing method in which drawing data segmented as arrayed of areas and drawing data for each of the unit areas is converted to energy beam control information, the read out sequence of the segmented area drawing data is read into a converter of the drawing system reversely with respect to the axis of symmetry and the drawing data for the unit area is varied with respect to the direction of the axis of symmetry such that the drawing data is symmetric with respect to the axis of symmetry.

6. A method according to claim 4, wherein in a drawing method in which drawing data is converted to bit pattern data, which is energy beam control information, for each of the unit areas, the read out sequence of the drawing data is read into the converter of the drawing system reversely with respect to the axis of symmetry and the read out sequence of the bit pattern data is also read from the converter into the drawing system reversely with respect to the axis of symmetry to draw symmetrically with respect to the axis of symmetry.

7. A method of drawing a pattern on a sample placed on a table by shifting the table continuously in a first direction while irradiating, with an energy beam, a selected area within a predetermined range and stepshifting the table in a second direction normal to the first direction at the end of the continuous shift in the first direction, comprising the steps of:

shifting the table in said second direction while shifting it in a first direction, with the selected area within the predetermined range being irradiated with the energy beam, such that the locus of the irradiated area actually formed on the sample becomes a curved line.

8. A method according to claim 7, wherein the energy beam is scanned in the direction normal to the first direction in which the table is shifted so that the selected area within the predetermined range is irradiated with the energy beam, thereby drawing a pattern.

9. A method according to claim 7, wherein the shape of the cross section of the energy beam coincides with said pattern, and the energy beam is irradiated on a drawing position on the sample.

10. A drawing system comprising:

an energy beam source for outputting an energy beam;

a beam deflecting means for deflecting the energy beam produced by said energy beam source in a first direction and a second direction simultaneously and independently of each other;

a beam reflecting controller for driving said beam deflection means;

a movable XY table on which a sample to be irradiated with the energy beam is mounted;

a table driving means for shifting said XY table in a first and second directions simultaneously and independently of each other;

a table driver controller coupled to said table driver for driving the table driver; and a control means having a beam control unit, a bit conversation unit, a measuring unit, a sync generation unit and a CPU, wherein the means for controlling the table causes an area to be irradiated with the energy beam in a second direction and such that the table driver drives the table in a second direction with a curve interpolation signal for shifting the energy beam in the second direction during the continuous movement of the table such that the locus of the area irradiated with the energy beam during the continuous shift may become a first curved line substantially parallel to the first direction or an approximately curved line composed of partial approximate straight lines.

11. A system according to claim 10, further comprising:

an operation section for calculating the direction of the normal of the first curved line or the approximate second curved line in the position irradiated with the energy beam in accordance with the curve interpolation signal representing the first curved line or approximate second curved line, and a device for generating a deflecting signal for correcting the scan direction of the energy beam within the predetermined range to be parallel to the direction of the normal in accordance with a signal representing the direction of the normal calculated by the operation section.

12. A system according to claim 10, wherein said device for directing the energy beam includes a plate having an opening corresponding to the shape of a pattern, the cross section of the energy beam is being made to coincide with the shape of the pattern through said opening, and means for shifting the energy beam in accordance with the movement of said table.

13. A drawing system comprising:

an energy beam source for outputting an energy beam;

a beam deflecting means for deflecting the energy beam produced by said energy beam source in a first direction and a second direction simultaneously and independently of each other;

a beam reflecting controller for driving said beam deflection means;

a movable XY table on which a sample to be irradiated with the energy beam is mounted;

a table driving means for shifting said XY table in a first and second directions simultaneously and independently of each other;

a table driver controller coupled to said table driver for driving the table driver; and a control means having a beam control unit, a bit conversation unit, a measuring unit, a sync generation unit and a CPU, wherein the means for controlling the beam deflecting device causes an area to be irradiated with the energy beam in a second direction and such that the beam driver drives the beam in a second direction with a curve interpolation signal shifting the beam in the second direction such that the locus of the area irradiated with the energy beam during the continuous shift may become a first curved line substantially parallel to the first direction or an approximately curved line composed of partial approximate straight lines.

14. A system according to claim 13, further comprising:

an operation section for calculating the direction of the normal of the first curved line or the approximate second curved line in the position irradiated with the energy beam in accordance with the curve interpolation signal representing the first curved line or approximate second curved line, and a device for generating a deflecting signal for correcting the scan direction of the energy beam within the predetermined range to be parallel to the direction of the normal in accordance with a signal representing the direction of the normal calculated by the operation section.

15. A system according to claim 13, wherein said device for directing the energy beam includes a plate having an opening corresponding to the shape of a pattern, the cross section of the energy beam is being made to coincide with the shape of the pattern through said opening, and means for shifting the energy beam in accordance with the movement of said table.

* * * * *